(12) United States Patent
Kang

(10) Patent No.: US 9,847,227 B2
(45) Date of Patent: Dec. 19, 2017

(54) METHOD FOR FORMING PATTERNS OF SEMICONDUCTOR DEVICE

(71) Applicant: SK hynix Inc., Gyeonggi-do (KR)

(72) Inventor: Chun-Soo Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/940,221

(22) Filed: Nov. 13, 2015

(65) Prior Publication Data

US 2017/0025284 A1    Jan. 26, 2017

(30) Foreign Application Priority Data

Jul. 24, 2015   (KR) .................. 10-2015-0105235

(51) Int. Cl.
*H01L 21/033* (2006.01)

(52) U.S. Cl.
CPC ................ *H01L 21/0337* (2013.01)

(58) Field of Classification Search
CPC . H01L 21/027; H01L 21/033; H01L 21/0331; H01L 21/0332; H01L 21/0334; H01L 21/0335; H01L 21/0337; H01L 21/0338
See application file for complete search history.

(56) References Cited

U.S. PATENT DOCUMENTS

| 8,173,549 B2 | 5/2012 | Lee et al. |
| 2008/0261389 A1 | 10/2008 | Jung |
| 2011/0124198 A1* | 5/2011 | Lee ................. H01L 21/0337 438/735 |
| 2011/0147889 A1 | 6/2011 | Tsuchiya |

FOREIGN PATENT DOCUMENTS

KR    100942074    2/2010

* cited by examiner

*Primary Examiner* — Julia Slutsker
(74) *Attorney, Agent, or Firm* — IP & T Group LLP

(57) ABSTRACT

A method for forming patterns of a semiconductor device includes preparing an etch target layer defined with a first region and a second region; forming a regular first feature which is positioned over the etch target layer in the first region and a random feature which is positioned over the etch target layer in the second region; forming a regular second feature over the regular first feature; forming first and second cutting barriers which expose a portion of the random feature, over the random feature; cutting the regular first feature using the regular second feature, to form a regular array feature; cutting the random feature using the first cutting barrier and the second cutting barrier, to form a random array feature; and etching the etch target layer by using the regular array feature and the random array feature, to form a regular array pattern and a random array pattern.

10 Claims, 34 Drawing Sheets

METHOD FOR FORMING PATTERNS OF SEMICONDUCTOR DEVICE

CROSS-REFERENCE TO RELATED APPLICATION

This application claims priority under 35 U.S.C. §119 to Korean Patent Application No. 10-2015-0105235 filed on Jul. 24, 2015, the disclosure of which is herein incorporated by reference in its entirety.

TECHNICAL FIELD

Exemplary embodiments relate to a method for manufacturing a semiconductor device, and more particularly, to a method for forming patterns.

DISCUSSION OF THE RELATED ART

Recently, the design rule of a semiconductor device is decreasing overall size. Thus, difficulties exist in forming patterns with fine pitches due to a limit in the resolution of a photolithography process.

In order to overcome the limit in the resolution of a photolithography process, various patterning methods such as a spacer patterning technology (SPT) have been suggested.

In this regard, it is necessary to develop a new process for concurrently forming fine patterns with different pattern densities in a region with a relatively high pattern density, such as a cell array region, and a region with a relatively low pattern density, such as a peripheral circuit region or a core region.

SUMMARY

Various embodiments are directed to a method for forming patterns of a semiconductor device which is capable of concurrently forming patterns of various sizes and various pitches.

In an embodiment, a method for forming patterns of a semiconductor device may include: preparing an etch target layer which includes a first region and a second region; forming a regular first feature and a random feature, wherein the regular first feature is positioned over the etch target layer in the first region, wherein the random feature is positioned over the etch target layer in the second region; forming a regular second feature, a first cutting barrier and a second cutting barrier, wherein the regular second feature is positioned over the regular first feature in the first region, wherein the first cutting barrier and the second cutting barrier is positioned over the random feature in the second region; patterning the regular first feature by using the regular second feature as an etching mask to form a regular array feature; patterning the random feature by using the first cutting barrier and the second cutting barrier as an etching mask to form a random array feature; and etching the etch target layer by using the regular array feature and the random array feature as an etch mask to form a regular array pattern and a random array pattern.

In an embodiment, a method for forming patterns of a semiconductor device may include: preparing an etch target layer, wherein the etch target layer includes a first region, a second region, and a third region; forming a regular first feature, a random feature, and a large pitch feature, wherein the regular first feature is positioned over the etch target layer in the first region, wherein the random feature is positioned over the etch target layer in the second region, and wherein the large pitch feature is positioned over the etch target layer in the third region; forming a regular second feature over the regular first feature; forming a first cutting barrier and a second cutting barrier, which expose a portion of the random feature, over the random feature; patterning the regular first feature by using the regular second feature as an etching mask to form a regular array feature; patterning the random feature by using the first cutting barrier and the second cutting barrier as an etching mask to form a random array feature; and patterning the etch target layer by using the regular array feature, the random array feature, and the large pitch feature as an etching mask to form a regular array pattern, a random array pattern, and a large pitch pattern, respectively.

In an embodiment, a method for forming patterns of a semiconductor device may include: forming a plurality of random first lines over an etch target layer; forming a first spacer layer over the plurality of random first lines; forming a plurality of random second lines, which fill spaces between the plurality of random first lines, over the first spacer layer; forming a random feature including the plurality of random first lines and the plurality of random second lines by removing the first spacer layer; forming a first cutting barrier over a portion of the random feature; forming a second spacer layer over the first cutting barrier; forming a second cutting barrier over the second spacer layer, wherein the second cutting barrier is located above the random feature and does not overlap with the first cutting barrier; and etching the second spacer layer and the random feature by using the first cutting barrier and the second cutting barrier as an etching mask.

The present technology may improve critical dimension uniformity (CDU) of a regular array pattern.

The present technology may improve patterning and process margins of a random array pattern.

The present technology may form fine patterns by applying a spacer patterning technology (SPT) simultaneously to not only a cell array region constructed by a regular array pattern but also a core region constructed by a random array pattern. Therefore, since patterns are formed by using the spacer patterning technology (SPT) even in the core region, a line critical dimension (line CD) may be decreased, and accordingly, a pitch may be decreased and a patterning margin may be increased.

The present technology may concurrently realize patterns of various pitches and various shapes by using 2 Immersion masks and 1 KrF mask.

DETAILED DESCRIPTION

Figure 1A:
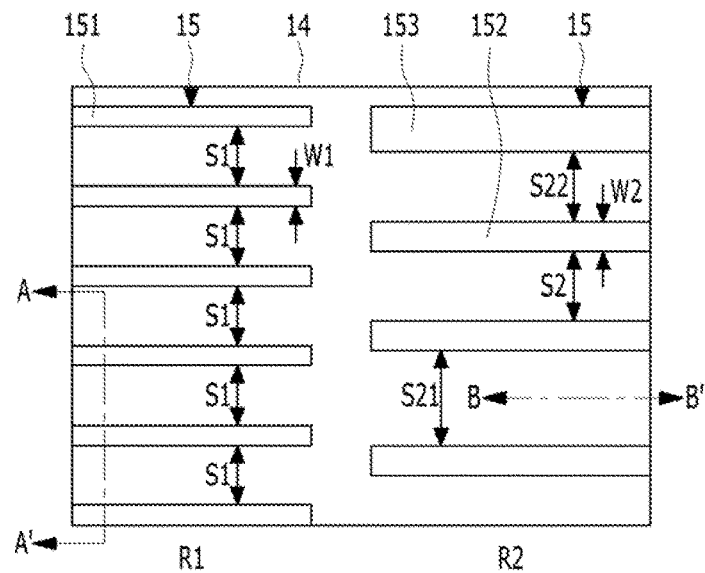
FIGS. 1A to 1O are plan views illustrating a method for forming patterns of a semiconductor device in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Figure 2A:
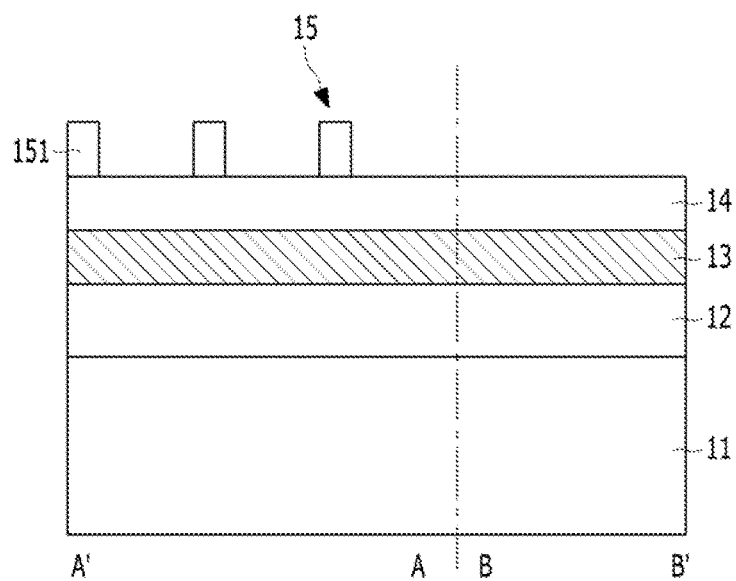
FIGS. 2A to 2O are cross-sectional views taken along the lines A-A' and B-B' of FIGS. 1A to 1O.

FIGS. 1A to 1O are plan views illustrating a method for forming patterns of a semiconductor device in accordance with a first embodiment. FIGS. 2A to 2O are cross-sectional views taken along the lines A-A' and B-B' of FIGS. 1A to 1O.

As shown in FIGS. 1A and 2A, an etch target layer 11 may be prepared. The etch target layer 11 may include suitable materials for semiconductor processing. The etch target layer 11 may include a semiconductor substrate. For example, the etch target layer 11 may include a silicon substrate, a silicon germanium (SiGe) substrate or an Silicon On Insulator (SOI) substrate. Also, the etch target layer 11 may include a dielectric material or a conductive material. For example, the etch target layer 11 may include a silicon oxide, a silicon nitride, a polysilicon, a metallic material, or a combination thereof. The etch target layer 11 may include a dielectric material which is formed on a semiconductor substrate.

The etch target layer 11 may include a first region R1 and a second region R2. The first region R1 may be a region in which a regular array pattern is formed. The second region R2 may be a region in which a random array pattern is formed. The density of patterns in the first region R1 is high, and the density of patterns in the second region R2 is low. For example, in the case in which the present embodiment is applied to a DRAM, the first region R1 may include a cell array region, and the second region R2 may include a core region. For reference, the "cell array region" described in the present specification may be defined as a region where a plurality of memory cells are formed. The "core region" may be defined as a region where sense amplifiers (SA), sub word line drivers (SWD), or the likes are formed.

The regular array pattern and the random array pattern may be formed by a spacer patterning technology (SPT). As will be described later, processes for forming the regular array pattern and the random array pattern may be integrated. In the regular array pattern, a plurality of patterns with the same shape, hereinafter, referred to as "regular patterns", may be arranged at a regular pitch. A pitch refers to the sum of the width of each pattern and the interval between patterns. In the random array pattern, a plurality of patterns with different shapes, that is, random shapes, hereinafter, referred to as "random patterns", may be arranged at random pitches. In the present specification, "random" does not mean "completely random". The random array pattern may include a partially random array in which a random array and a regular array are mixed. That is to say, the random array pattern may include a case in which regular patterns and random patterns are randomly arranged.

A hard mask layer 12 may be formed on the etch target layer 11. The hard mask layer 12 may include a material which has an etching selectivity with respect to the etch target layer 11. The hard mask layer 12 may include a silicon oxide, a silicon oxynitride, a polysilicon, an amorphous carbon, or a combination thereof. The hard mask layer 12 may be used as an etch mask for etching the etch target layer 11. The hard mask layer 12 may be a multi-layered structure. The hard mask layer 12 may be omitted.

A first line layer 13 may be formed on the hard mask layer 12. The first line layer 13 may be formed of a material which has an etching selectivity with respect to the hard mask layer 12. The first line layer 13 may include a silicon oxide, a silicon oxynitride, a polysilicon, an amorphous carbon, or a combination thereof. The first line layer 13 may be used as an etch mask for etching the hard mask layer 12.

A sacrificial layer 14 may be formed on the first line layer 13. The sacrificial layer 14 may be formed of a material which has an etching selectivity with respect to the first line layer 13. The sacrificial layer 14 may include a silicon oxide, a silicon oxynitride, a polysilicon, an amorphous carbon, or a combination thereof. The sacrificial layer 14 may be formed of a stack including a plurality of layers.

First masks 15 may be formed on the sacrificial layer 14. The first masks 15 may be formed by a lithography process. For example, the first masks 15 may be formed by an immersion lithography process. The first masks 15 may include photoresist patterns. The first masks 15 may be line/space shape patterns. The first masks 15 may include a plurality of first parts 151 which are positioned in the first region R1 and a plurality of second parts 152 which are positioned in the second region R2.

The first parts 151 may have a first width W1, and neighboring first parts 151 may be regularly arranged with a first space S1. The second parts 152 may have a second width W2, and neighboring second parts 152 may be irregularly arranged with second spaces S2 and S21. The first width W1 and the second width W2 may be different from each other.

The first space S1 and the second spaces S2 and S21 may be different from each other. In this way, the first parts 151 and the second parts 152 which are respectively formed in the first region R1 and the second region R2 may be formed with different widths and spaces, that is, different pitches. The second region R2 may further include a wide-width second part 153 which has a width larger than the second parts 152. The wide-width second part 153 may be larger in width than either the first parts 151 or the second parts 152. A space S22 between the second part 152 and the wide-width second part 153 may be the same as or different from the second space S2.

In this way, the first masks 15 may include regular parts and random parts. The regular parts may include the plurality of first parts 151, and the random parts may include the plurality of second parts 152 and the wide-width second part 153. As the regular parts, the plurality of first parts 151 may be formed at a regular pitch, and, as the random parts, the plurality of second parts 152 and the wide-width second part 153 may be formed at irregular pitches. Each of the first parts 151, the second parts 152 and the wide-width second part 153 may be in a line shape and each may extend in a first direction.

Figure 1B:
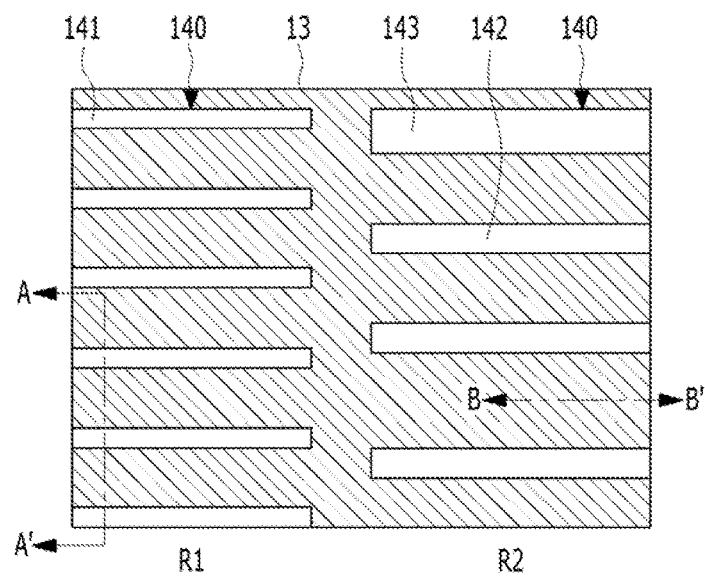
Figure 2B:
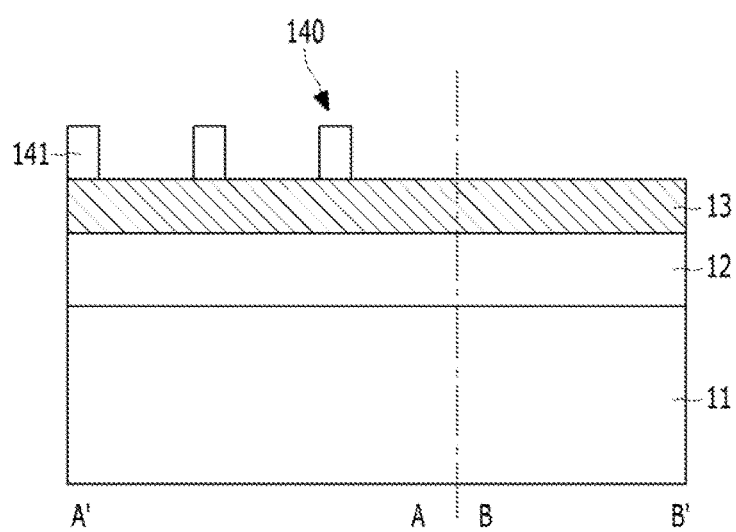

As shown in FIGS. 1B and 2B, the sacrificial layer 14 may be etched. For example, the sacrificial layer 14 may be etched using the first masks 15. As a result, sacrificial layer patterns 140 may be formed. When viewed on the top, the sacrificial layer patterns 140 may be the same in shape as the first masks 15. Accordingly, the sacrificial layer patterns 140 may include regular parts and random parts. For example, the sacrificial layer patterns 140 may include first parts 141, second parts 142, and a wide-width second part 143. The first parts 141 of the sacrificial layer patterns 140 have the same shape as the first parts 151 of the first masks 15. The second parts 142 and the wide-width second part 143 of the sacrificial layer patterns 140 have the same shapes as the second parts 152 and the wide-width second part 153 of the first masks 15, respectively. Next, the first masks 15 may be removed.

Figure 1C:
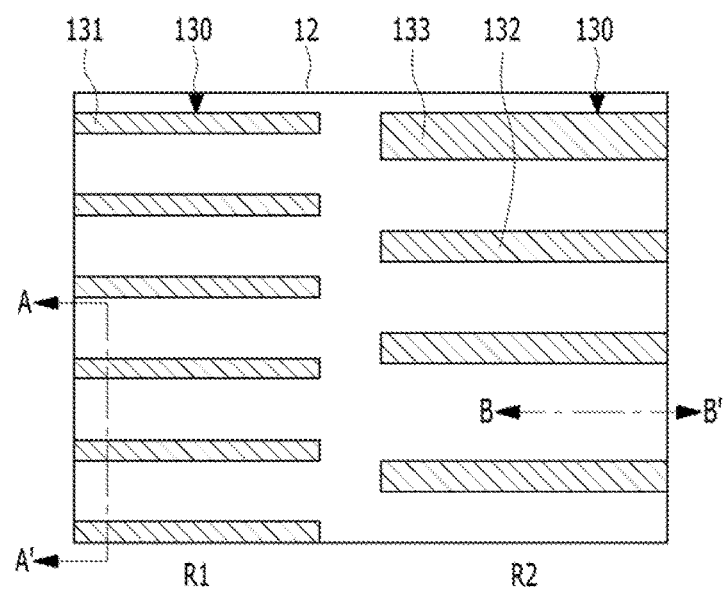
Figure 2C:
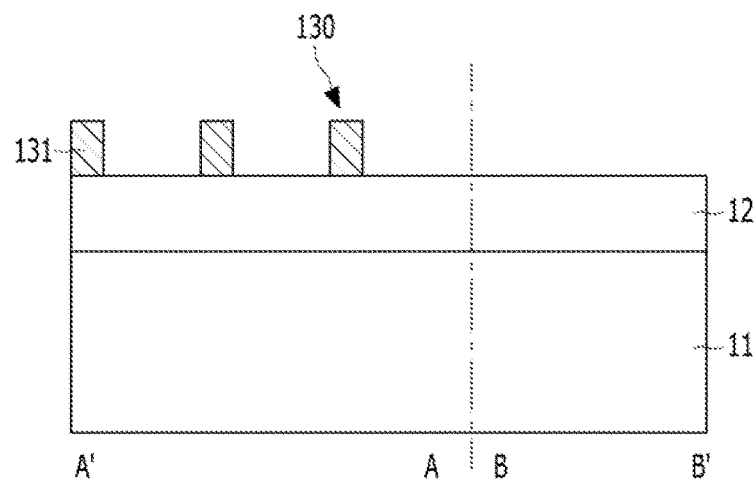

As shown in FIGS. 1C and 2C, the first line layer 13 may be etched using the sacrificial layer patterns 140 as etch barriers. Thus, a plurality of first lines 130 may be formed. The first lines 130 may be the same in shape as the sacrificial layer patterns 140. Accordingly, the first lines 130 may include regular parts and random parts. For example, the first lines 130 may include first parts 131, second parts 132, and a wide-width second part 133. The first parts 131 of the first lines 130 have the same shape as the first parts 141 of the sacrificial layer patterns 140. The second parts 132 and the wide-width second part 133 of the first lines 130 have the same shapes as the second parts 142 and the wide-width second part 143 of the sacrificial layer patterns 140, respectively.

In this way, the first lines 130 may be concurrently formed in the first region R1 and the second region R2. When viewed from the top, the second parts 132 and the wide-width second part 133 may be formed at irregular pitches in the second region R2. The first parts 131 may be regularly formed in the first region R1.

Hereinafter, the first parts 131 formed in the first region R1 will be referred to as "regular first lines 131", and the second parts 132 and the wide-width second part 133 formed in the second region R2 will be respectively referred to as "random first lines 132" and a "wide-width random first line 133". Next, the sacrificial layer patterns 140 may be removed. Thus, the etch target layer 12 may be exposed under the first lines 130.

Figure 1D:
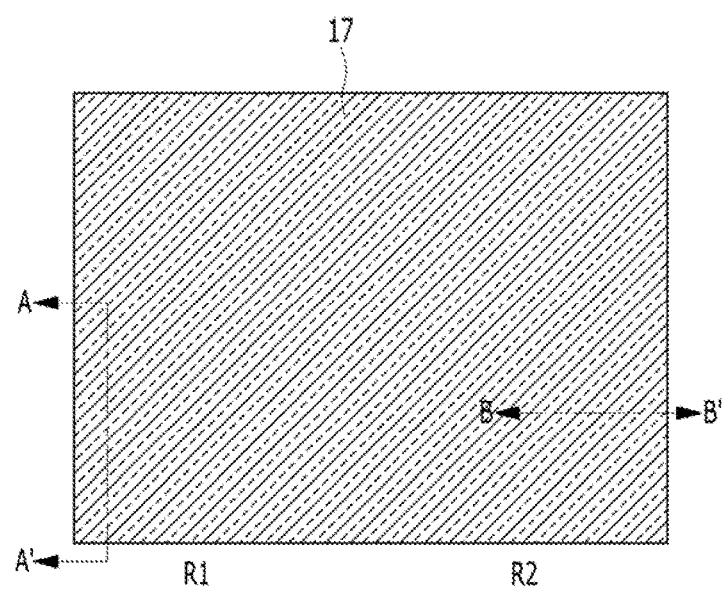
Figure 2D:
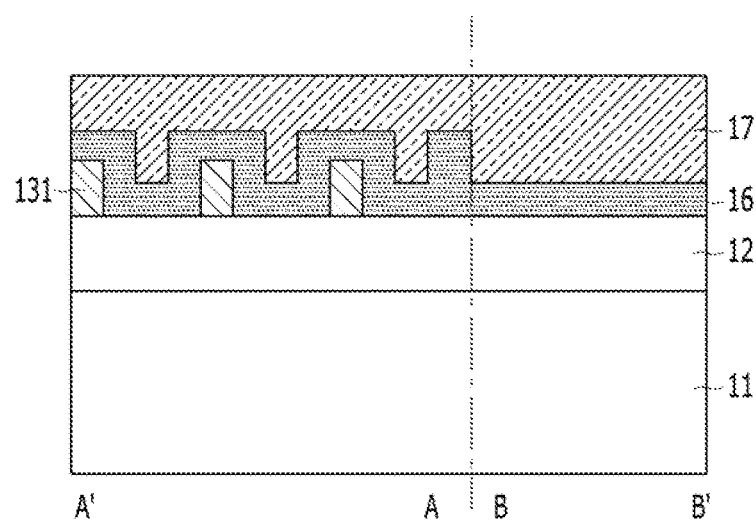

As shown in FIGS. 1D and 2D, a first spacer layer 16 may be formed. The first spacer layer 16 may be conformally formed on the entire surface including the regular first lines 131, the random first lines 132 and the wide-width random first line 133. The first spacer layer 16 may include a material which has an etching selectivity with respect to the regular first lines 131, the random first lines 132 and the wide-width random first line 133. The first spacer layer 16 may include a silicon oxide. The first spacer layer 16 may be formed of an ultra low temperature oxide (ULTO).

Next, a second line layer 17 may be formed on the first spacer layer 16. The second line layer 17 may be formed on the first spacer layer 16 while filling gaps between portions of the first spacer layer 16, that is, spaces between the regular first lines 131. The second line layer 17 may also be filled between neighboring random first lines 132 and between the random first line 132 and the wide-width random second line 133. Subsequently, the top surface of the second line layer 17 may be planarized. The second line layer 17 may be formed of a material which has an etching selectivity with respect to the first spacer layer 16. The second line layer 17 may include a polysilicon.

Figure 1E:
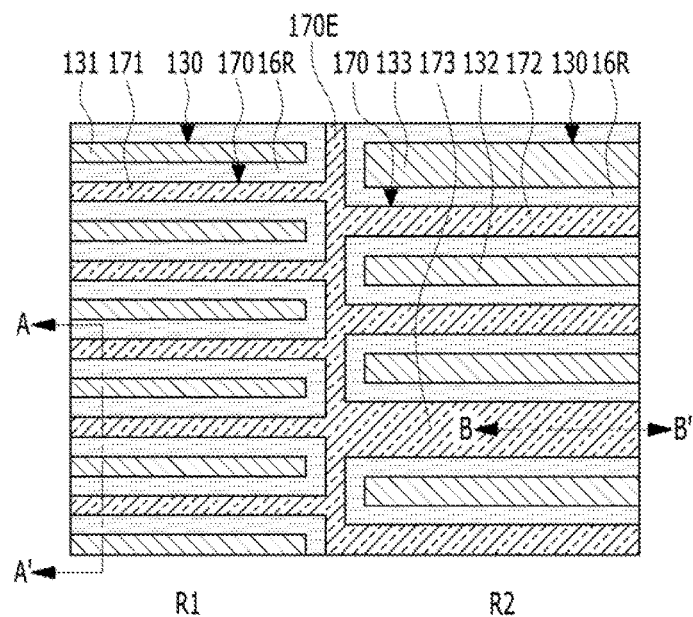
Figure 2E:
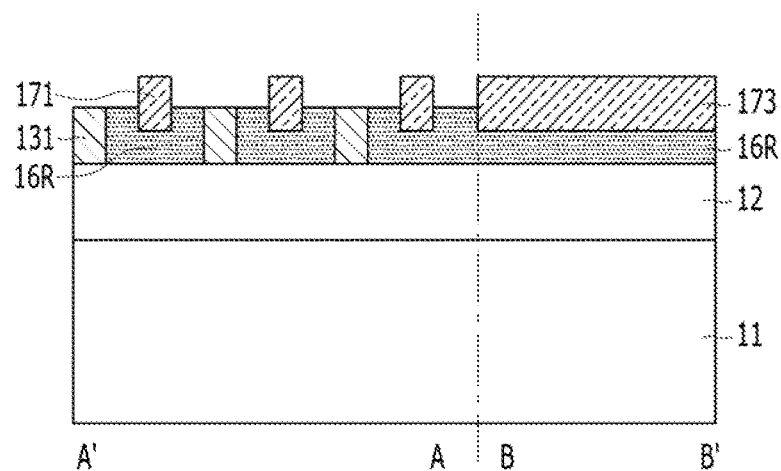

As shown in FIGS. 1E and 2E, the second line layer 17 is selectively etched. For example, the second line layer 17 is selectively etched by an etch-back process. Thus, a plurality of second lines 170 may be formed, and the first spacer layer 16 may be exposed by the second lines 170.

In succession, portions of the first spacer layer 16 are selectively etched. The portions of the first spacer layer 16 may be etched until the top surfaces of the first lines 130 are exposed. According to this fact, a first spacer layer 16R may selectively remain on only the bottoms and sidewalls of the second lines 170.

The second lines 170 may include regular parts and random parts. For example, the second lines 170 may include first parts 171, second parts 172, and a wide-width second part 173. The plurality of first parts 171 may be regularly formed in the first region R1, and the plurality of second parts 172 and the wide-width second part 173 may be formed at irregular pitches in the second region R2. Hereinafter, the first parts 171 formed in the first region R1 will be referred to as "regular second lines 171", and the second parts 172 formed in the second region R2 will be referred to as "random second lines 172". The wide-width second part 173 will be referred to as a "wide-width random second line 173". The wide-width random second line 173 may be larger in its width than the random second lines 172.

The regular second lines 171 may be positioned between the regular first lines 131, and the random second lines 172 and the wide-width random second line 173 may be positioned between the random first lines 132 and between the random first line 132 and the wide-width random first line 133. The regular first lines 131 and the regular second lines 171 may be the same in their line widths. The random first lines 132 and the random second lines 172 may be different in line width. The second lines 170 may include an edge second line 170E. The edge second line 170E may be positioned in the interfacial area of the first region R1 and the second region R2, that is, on the edge of the first region R1.

The first spacer layer 16R may be positioned between the regular second lines 171 and the regular first lines 131, and may be positioned between the random second lines 172 and the random first lines 132. The first spacer layer 16R may also be positioned between the wide-width random second line 173 and the random first lines 132. The first spacer layer 16R may also remain between the wide-width random first line 133 and the random second line 172.

Figure 1F:
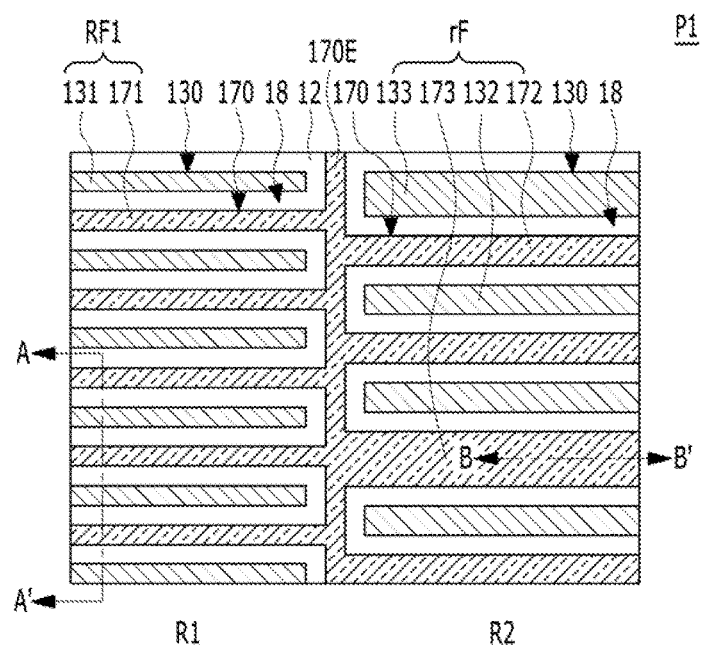
Figure 2F:
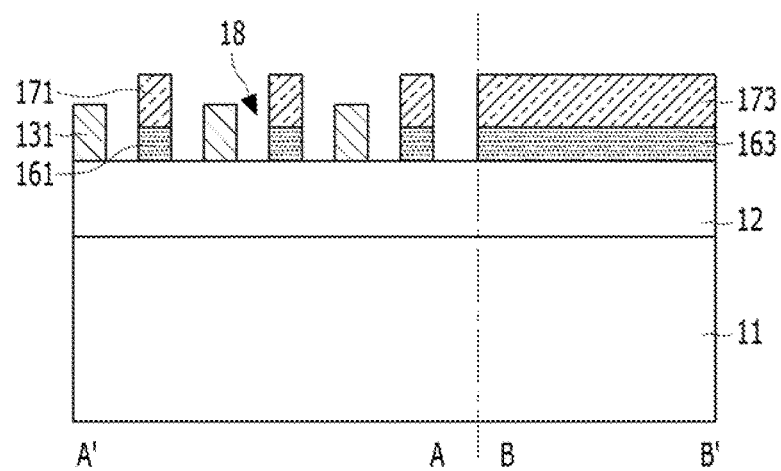

As shown in FIGS. 1F and 2F, the surface of the hard mask layer 12 is exposed. For example, the first spacer layer 16R may be etched between the regular second lines 171 and the regular first lines 131. Concurrently with this, the first spacer layer 16R may also be etched between the random second lines 172 and the random first lines 132, between the wide-width random second line 173 and the random first lines 132, and between the wide-width random first line 133 and the random second line 172.

In this way, by etching the first spacer layer 16R, first spacer layer patterns 161 and 163 may be formed under the regular second lines 171 and the wide-width random second line 173. While not shown, first spacer layer patterns may also be formed under the random second lines 172. Openings 18 may be formed between the regular first lines 131 and the regular second lines 171. When viewed from the top, the openings 18 may have shapes which surround the sidewalls of the regular first lines 131. Openings 18 may also be formed between the random first lines 132 and the random second lines 172, between the random first lines 132 and the wide-width random second line 173 and between the wide-width random first line 133 and the random second line 172. The width of the openings 18 may be determined by the width of the first spacer layer 16R. Therefore, the plurality of openings 18 may be the same as each other in size.

The regular first lines 131 and the regular second lines 171 may be formed alternately with each other. In the first region R1, the regular first lines 131 and the regular second lines 171 may alternate at a regular pitch, that is, at a uniform pitch. In the second region R2, the random first lines 132, the random second lines 172, the wide-width random first line 133 and the wide-width random second line 173 may be arranged at irregular pitches, that is, at a non-uniform pitch.

The regular first lines 131 and the regular second lines 171 may become first regular features RF1 which are positioned in the first region R1. The random first lines 132, the random second lines 172, the wide-width random first line 133 and the wide-width random second line 173 may become random features rF which are positioned in the second region R2. The regular first lines 131, the random first lines 132, the regular second lines 171, the random second lines 172, the wide-width random first line 133 and the wide-width random second line 173 may be referred to as a first partition P1. The first partition P1 may be positioned at a first level. The first level may mean a height level. The first partition P1 may be formed on the hard mask layer 12, and the surface portions of the hard mask layer 12 may be locally exposed by the plurality of openings 18. The series of processes for forming the first partition P1 are referred to as an negative spacer patterning technology (NSPT) process.

Figure 1G:
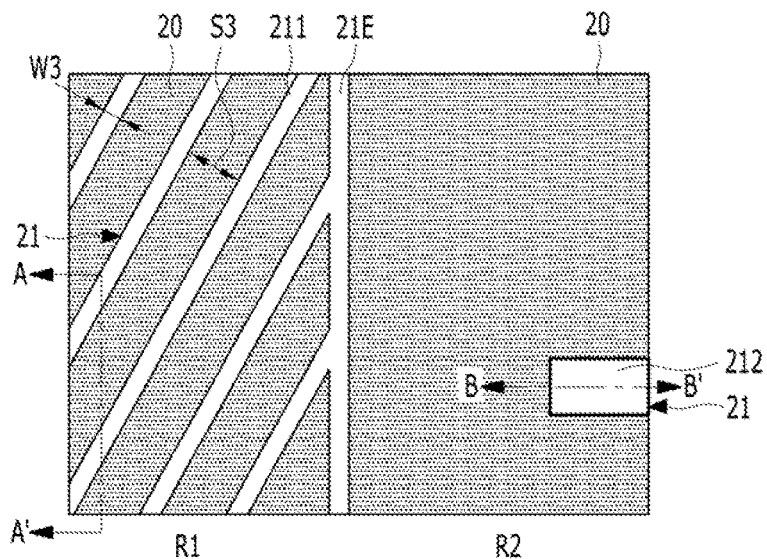
Figure 2G:
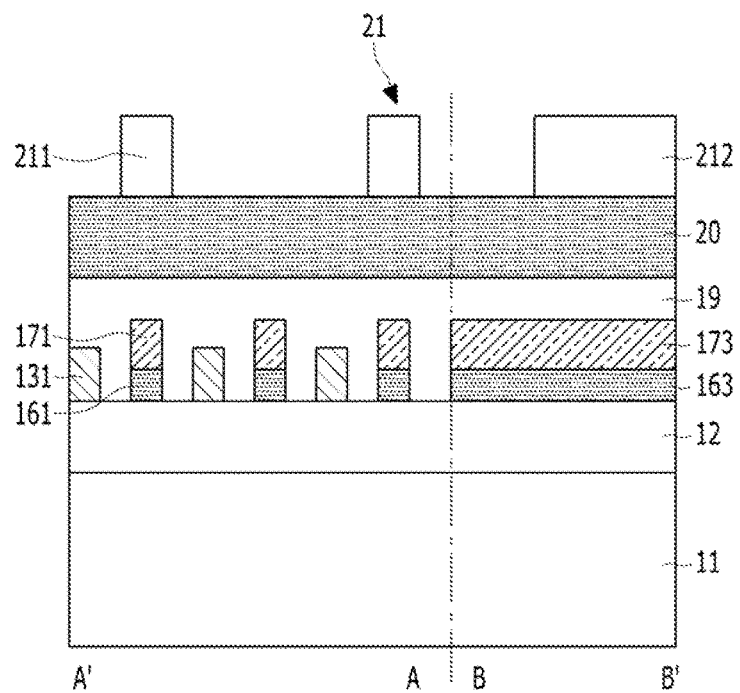

As shown in FIGS. 1G and 2G, a planarization layer 19 may be formed on the first partition P1. The planarization layer 19 may be formed by a spin-on coating method. A topology by the first partition P1 may be improved by the planarization layer 19. The planarization layer 19 may be formed of a material which has an etching selectivity with respect to the first partition P1. The planarization layer 19 may include a stack of a spin-on carbon layer and a silicon oxynitride.

A third line layer 20 may be formed on the planarization layer 19. The third line layer 20 may be formed of the same material as the planarization layer 19. The third line layer 20 may include a stack of a spin-on carbon layer and a silicon oxynitride.

Second masks 21 may be formed on the third line layer 20. The second masks 21 may be formed by a lithography process. For example, the second masks 21 may be formed by an immersion lithography process. The second masks 21 may include photoresist patterns. Some of the second masks 21 may be line/space type patterns. The second masks 21 may include a plurality of first parts 211 which are positioned in the first region R1 and a second part 212 which is positioned in the second region R2. The first parts 211 may have a third width W3, and neighboring first parts 211 may be regularly arranged with a third space S3. One second part 212 may be independently formed in the second region R2. Hereinafter, the second part 212 will be referred to as an island shape part 212. The island shape part 212 may partially overlap with the wide-width random second line 173.

In this way, the second masks 21 may include regular parts and the island shape part 212. The regular parts may include the plurality of first parts 211. As the regular parts, the plurality of first parts 211 may be formed at a regular pitch. The first parts 211 may be in line shapes which extend in any one direction.

The first parts 211 of the second masks 21 may cross the first partition P1. When viewed from the top, the first parts 211 of the second masks 21 may cross the regular first lines 131 and the regular second lines 171 at an angle of about 45°. The second masks 21 may further include an edge part 21E which is positioned in the interfacial area of the first region R1 and the second region R2. One end of each of the first parts 211 may be coupled to the edge part 21E.

Figure 1H:
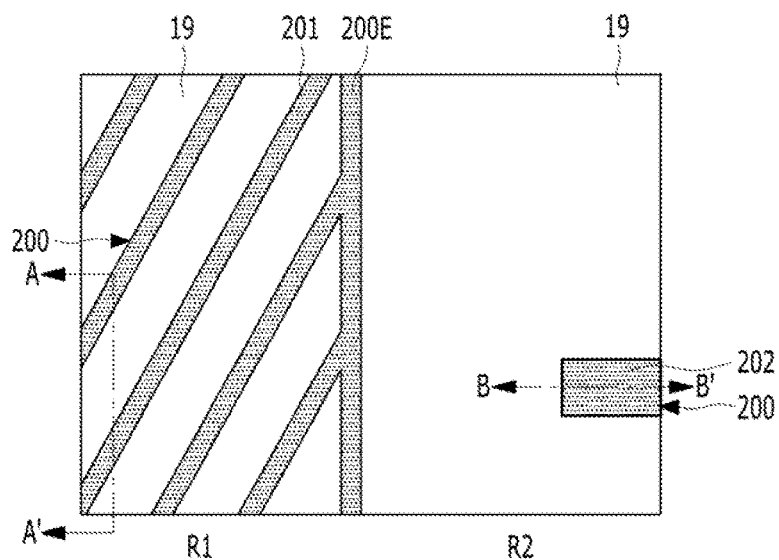
Figure 2H:
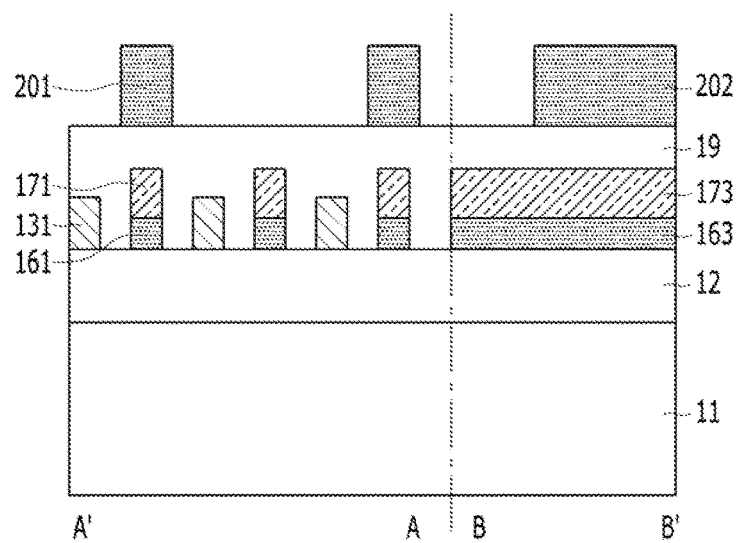

As shown in FIGS. 1H and 2H, the third line layer 20 may be selectively etched. For example, the third line layer 20 is etched using the second masks 21. Thus, third lines 200 may be formed. The third lines 200 may include regular third lines 201 which are formed in the first region R1. A first cutting barrier 202 may be formed concurrently when the regular third lines 201 are formed. The first cutting barrier 202 may be formed in the second region R2. The first cutting barrier 202 has a shape which partially overlaps with the wide-width random second line 173. The third lines 200 may include the plurality of regular third lines 201. The third lines 200 may further include an edge third line 200E which is positioned in the interfacial area of the first region R1 and the second region R2. One end of each of the regular third lines 201 may be coupled to the edge third line 200E.

The third lines 200 may be formed in the first region R1. When viewed from the top, the regular third lines 201 may have the same shape as the first parts 211 of the second masks 21. Accordingly, the regular third lines 201 may be regularly formed in the first region R1. After the third lines 200 are formed as described above, the second masks 21 may be removed.

Figure 1I:
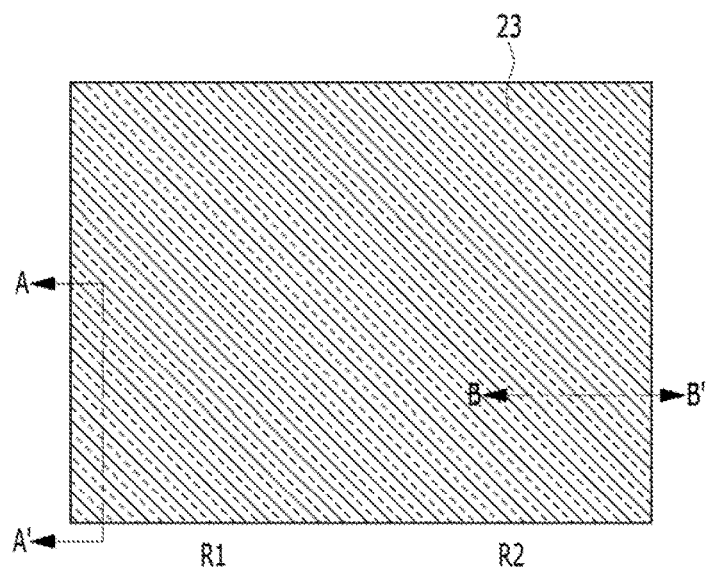
Figure 2I:
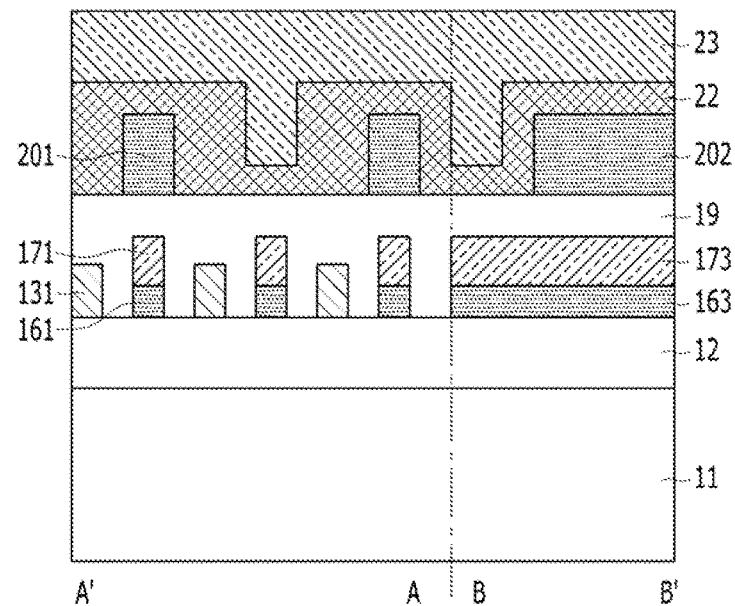

As shown in FIGS. 1I and 2I, a second spacer layer 22 may be formed. The second spacer layer 22 may be conformally formed on the entire surface including the regular third lines 201 and the first cutting barrier 202. The second spacer layer 22 may include a material which has an etching selectivity with respect to the regular third lines 201 and the first cutting barrier 202. The second spacer layer 22 may include a silicon oxide.

Next, a fourth line layer 23 may be formed on the second spacer layer 22. The fourth line layer 23 may be formed on the second spacer layer 22 while filling gaps between portions of the second spacer layer 22, that is, spaces between the regular third lines 201. Subsequently, the top surface of the fourth line layer 23 may be planarized. The fourth line layer 23 may cover both the first region R1 and the second region R2. The fourth line layer 23 may be formed of a material which has an etching selectivity with respect to the second spacer layer 22. The fourth line layer 23 may include a polysilicon. The fourth line layer 23 may use a spin-on carbon instead of a polysilicon.

Figure 1J:
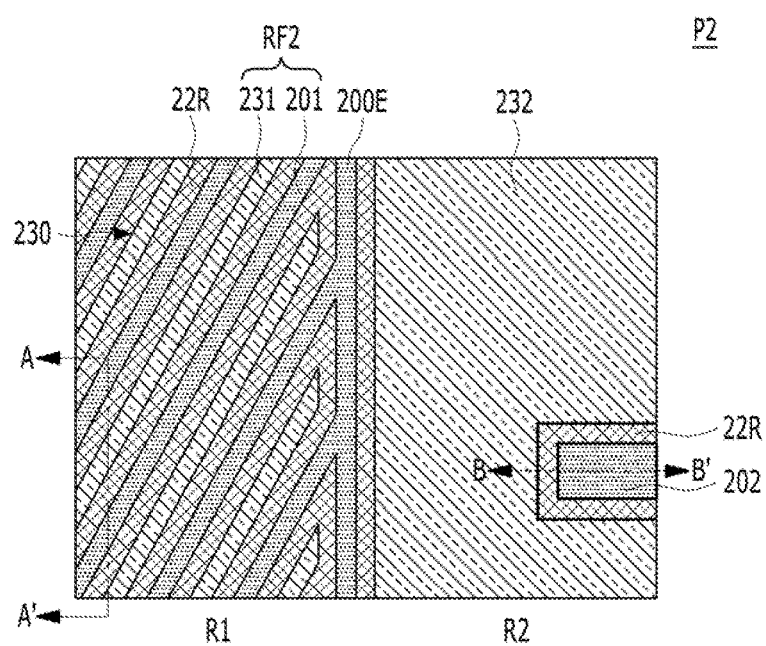
Figure 2J:
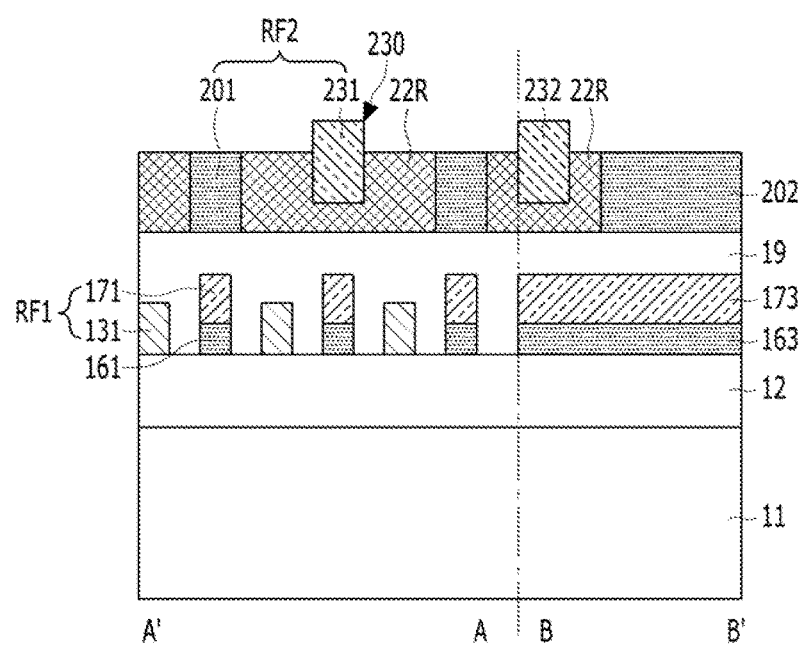

As shown in FIGS. 1J and 2J, the fourth line layer 23 is selectively etched. For example, the fourth line layer 23 is selectively etched by an etch-back process until the second spacer layer 22 is exposed. Thus, a plurality of fourth lines 230 may be formed, and the second spacer layer 22 may be exposed by the fourth lines 230. A second cutting barrier 232 may be formed concurrently when the fourth lines 230 are formed. The second cutting barrier 232 may be formed in the second region R2 and cover the second region R2 while surrounding the first cutting barrier 202.

Then, portions of the second spacer layer 22 are selectively etched. The portions of the second spacer layer 22 may be etched until the top surfaces of the regular third lines 201 are exposed. According to this fact, a second spacer layer 22R may selectively remain only on the bottoms and sidewalls of the fourth lines 230.

The fourth lines 230 may include a plurality of regular fourth lines 231, and the regular fourth lines 231 may be regularly formed in the first region R1. The second cutting barrier 232 may be formed in the second region R2.

The regular fourth lines 231 may be positioned between the regular third lines 201. The regular third lines 201 and the regular fourth lines 231 may be the same as each other in line width. The second spacer layer 22R may be positioned between the regular third lines 201 and the regular fourth lines 231, and may also be positioned between the first cutting barrier 202 and the second cutting barrier 232.

The regular third lines 201 and the regular fourth lines 231 may become second regular features RF2 which are positioned in the first region R1. The second regular features RF2 may be positioned over the first regular features RF1, and the first regular features RF1 and the second regular features RF2 may cross each other. The regular third lines 201 and the regular fourth lines 231 may be referred to as a second partition P2. The second partition P2 may be positioned at a second level. The second level as a height level may be higher than the first level of the first partition P1. The second partition P2 may be formed over the first partition P1. The series of processes for forming the second partition P2 are referred to as a negative SPT (NSPT) process. Thus, an NSPT process is applied 2 times to form the first partition P1 and the second partition P2.

Subsequently, a cutting process may be performed. The first regular features RF1 and the random features rF (see FIG. 1F) may be cut by the cutting process.

Figure 1K:
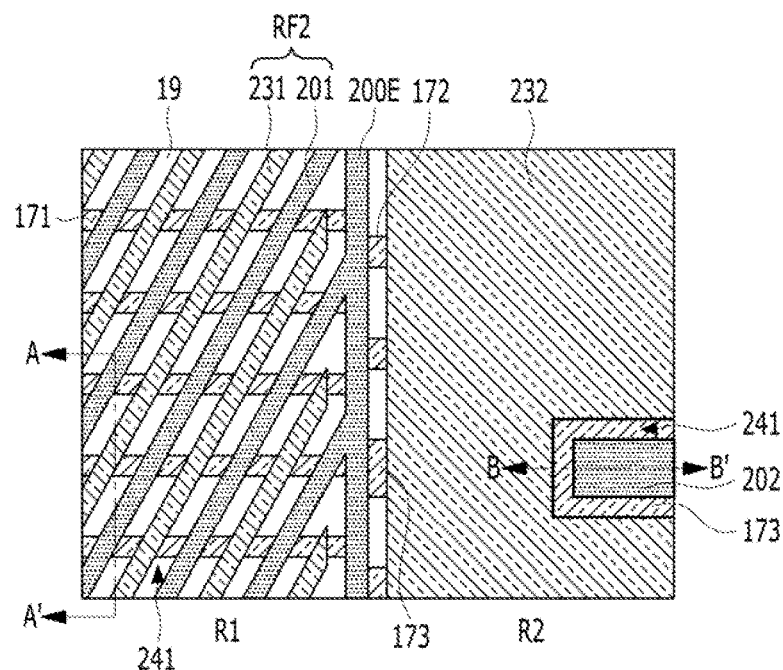
Figure 2K:
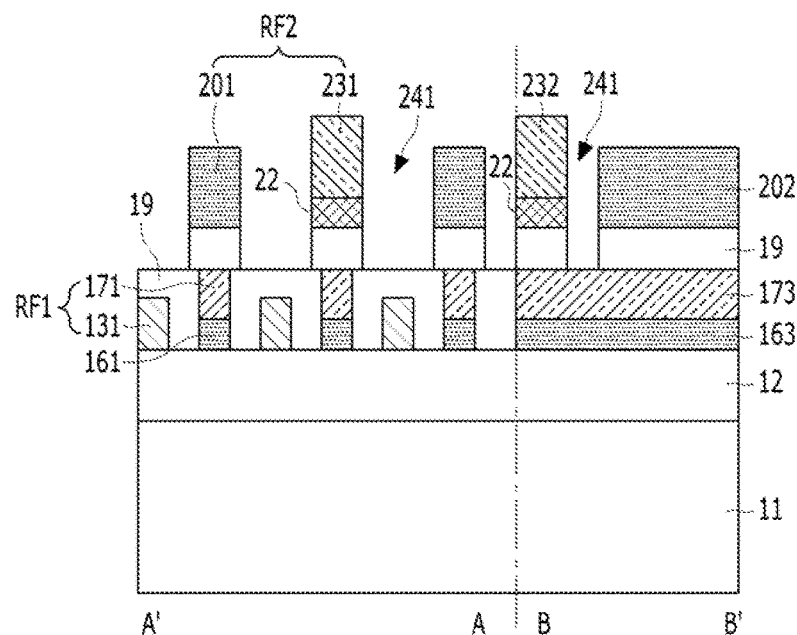

First, as shown in FIGS. 1K and 2K, the second spacer layer 22R is etched by using the second regular features RF2, the first cutting barrier 202, and the second cutting barrier 232 as etch masks. Thus, the surface of the planarization layer 19 may be exposed, and second spacer layer patterns 22 may be positioned under the regular fourth lines 231 and the second cutting barrier 232.

Then, by etching portions of the planarization layer 19, pre-cutting parts 241 are formed. By the pre-cutting parts 241, the top surfaces of the wide-width random second line 173, the random second lines 172, and the regular second lines 171 may be exposed.

Figure 1L:
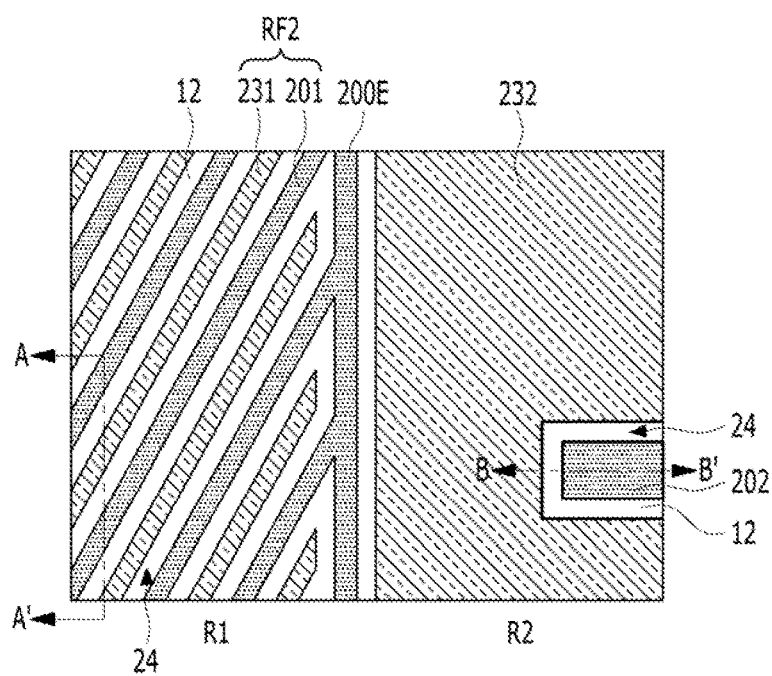
Figure 2L:
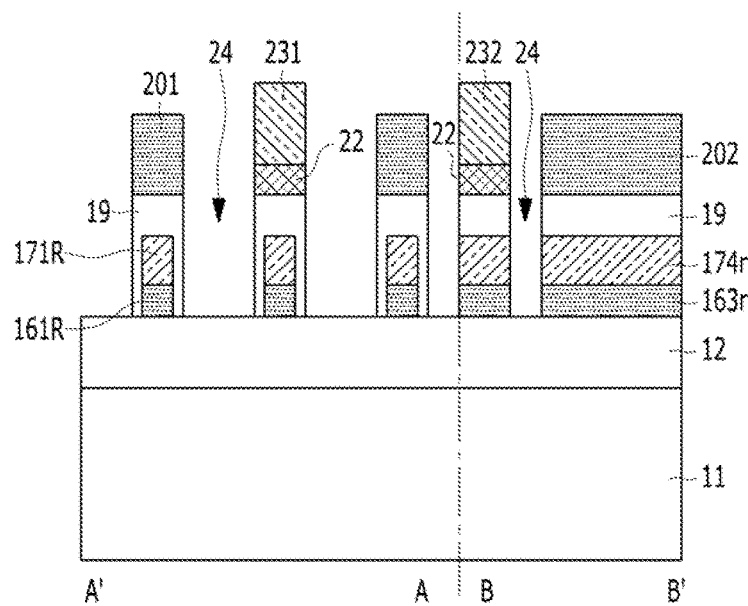

Next, as shown in FIGS. 1L and 2L, portions of the planarization layer 19, the wide-width random second line 173, the random second lines 172, and the regular second lines 171 which are exposed by the pre-cutting parts 241 are etched. Thus, the top surfaces of the regular first lines 131 may be exposed.

Then, by using the second regular features RF2, the first cutting barrier 202, and the second cutting barrier 232 as etch masks, the planarization layer 19 is etched such that the surface of the hard mask layer 12 is exposed. While etching the planarization layer 19, the regular first lines 131, the regular second lines 171, the random second lines 172, and the wide-width random second line 173 may be cut. See the reference number 24. In other words, by using the second regular features RF2, the first cutting barrier 202 and the second cutting barrier 232 as etch masks, the regular first lines 131, the regular second lines 171, the random second lines 172 and the wide-width random second line 173 may be etched.

The wide-width random second line 173 may be cut using the first cutting barrier 202 and the second cutting barrier 232. See the reference number 24. Thus, cut wide-width random second lines 174r may be formed. In the second region R2, a random array feature including the cut wide-width random second lines 174r may be formed.

When cutting the wide-width random second line 173 as indicated by the reference number 24 as described above, the regular second lines 171 may be etched in the first region R1. In the case when the regular second lines 171 and the regular first lines 131 are formed of the same material, the regular first lines 131 may be etched as well. For example, the second spacer layer 22R and the planarization layer 19 are sequentially etched by using the regular third lines 201 and the regular fourth lines 231 as etch barriers. Thus, the regular first lines 131 and the regular second lines 171 are exposed.

Then, the regular first lines 131 and the regular second lines 171 are cut. See the reference number 24. By the cutting of the regular second lines 171 (see the reference number 24), second regular parts 171R may be formed in the first region R1. By the cutting of the regular first lines 131 (see the reference number 24), first regular parts 131R (see FIG. 1M) may be formed. First spacer layer patterns 163r may be formed under the cut wide-width random second lines 174r. First spacer layer patterns 161R may be formed under the second regular parts 171R.

Figure 1M:
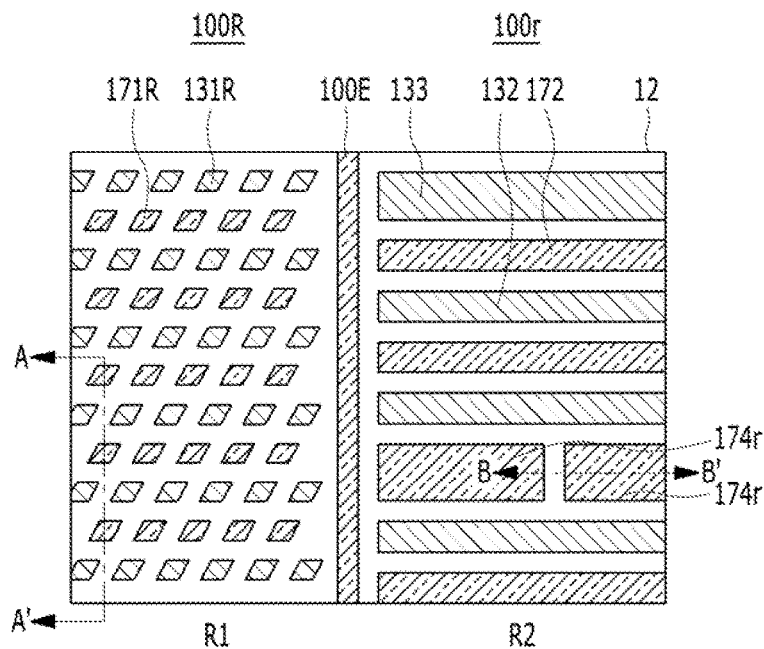
Figure 2M:
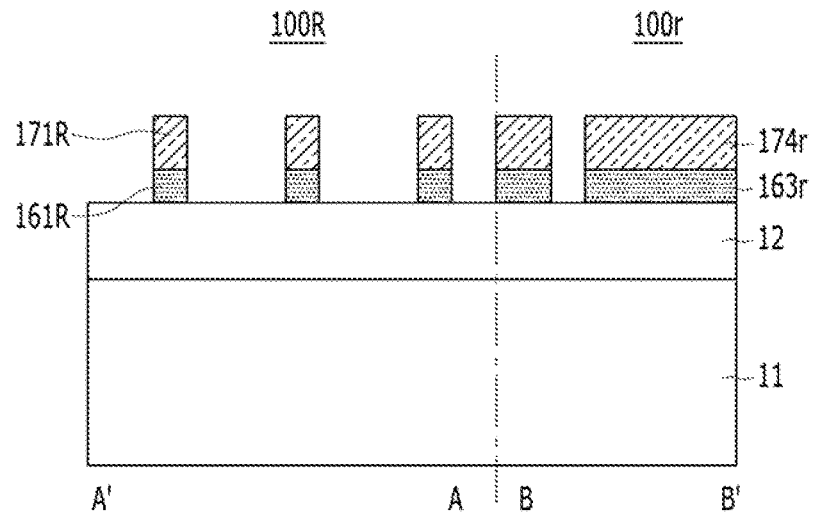

As shown in FIGS. 1M and 2M, a cleaning process may be performed. Thus, all materials on a regular array feature may be removed. By performing the cleaning process, a regular array feature 100R may be formed in the first region R1. The regular array feature 100R may include the first regular parts 131R which are formed by the cutting of the regular first lines 131 and the second regular parts 171R which are formed by the cutting of the regular second lines 171. A random array feature 100r may be formed in the second region R2. The random array feature 100r may include the cut wide-width random second lines 174r, the random second lines 172, the random first lines 132, and the wide-width random first line 133. The first spacer layer patterns 163r may remain under the cut wide-width random second lines 174r. The first spacer layer patterns 161R may remain under the second regular parts 171R. An edge feature 100E may be formed in the interfacial area of the first region R1 and the second region R2. The edge feature 100E may be formed by etching the edge second line 170E of the second lines 170.

Figure 1N:
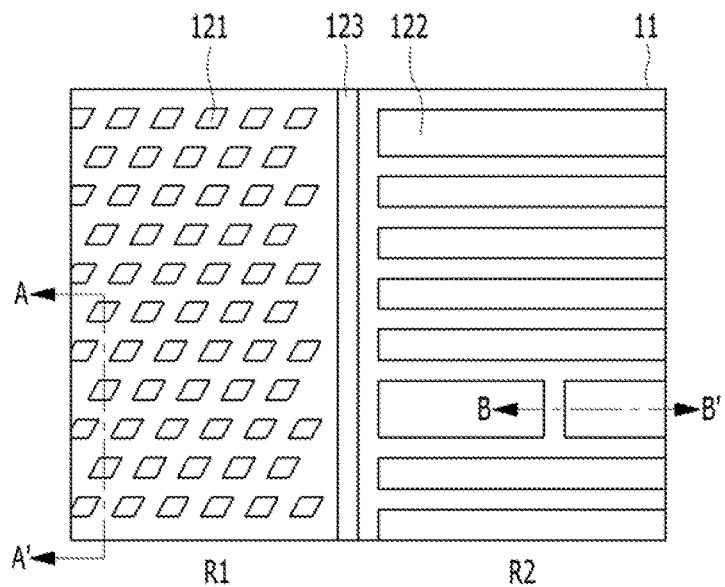
Figure 10:
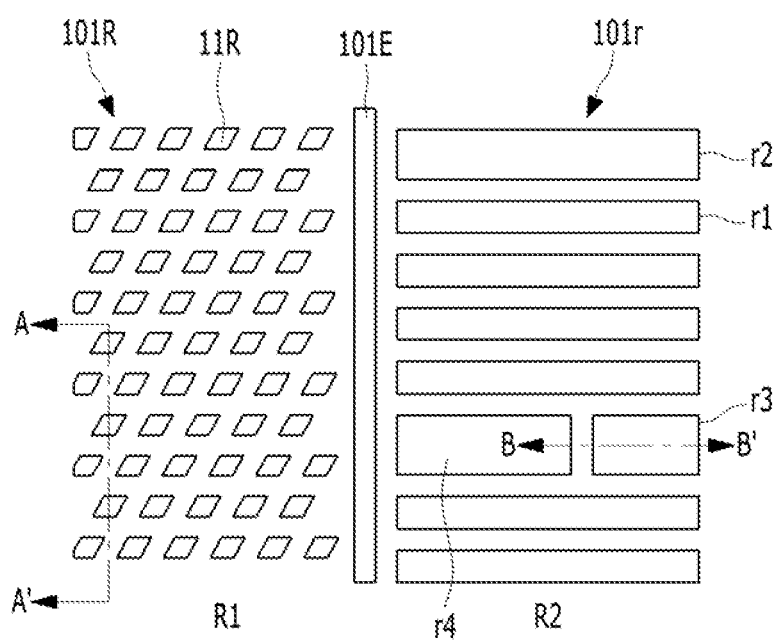
Figure 2N:
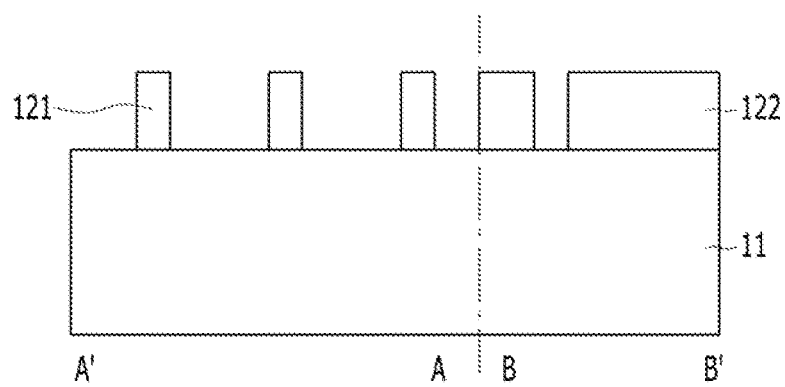
Figure 20:
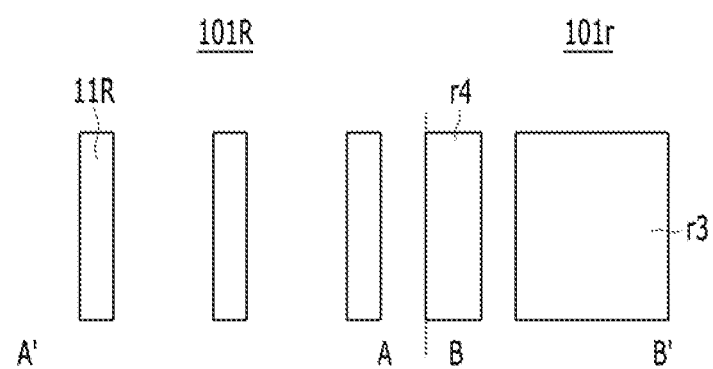

As shown in FIGS. 1N and 2N, the hard mask layer 12 is etched by using the regular array feature 100R, the random array feature 100r and the edge feature 100E as etch barriers. Thus, regular array hard mask patterns 121, random array hard mask patterns 122 and an edge hard mask pattern 123 may be formed. The regular array hard mask patterns 121 may be formed in the first region R1. The random array hard mask patterns 122 may be formed in the second region R2. The regular array feature 100R, the random array feature 100r and the edge feature 100E may be removed.

As shown in FIGS. 1O and 2O, the etch target layer 11 is etched by using the regular array hard mask patterns 121, the random array hard mask patterns 122 and the edge hard mask pattern 123 as etch barriers. Thus, a regular array pattern 101R, a random array pattern 101r and an edge pattern 101E may be concurrently formed. The regular array pattern 101R may include a plurality of regular patterns 11R. The random array pattern 101r may include a plurality of random patterns r1, r2, r3 and r4.

Next, the regular array hard mask patterns 121, the random array hard mask patterns 122 and the edge hard mask pattern 123 may be removed.

In another embodiment, the hard mask layer 12 may be omitted. In this case, in order to form the regular array pattern 101R and the random array pattern 101r, the etch target layer 11 may be directly etched by using the regular array feature 100R and the random array feature 100r as etch barriers.

As described above, in the first embodiment, by using a method of applying a spacer patterning technology (SPT) process twice, the regular array pattern 101R and the random array pattern 101r may be concurrently formed.

Figure 3A:
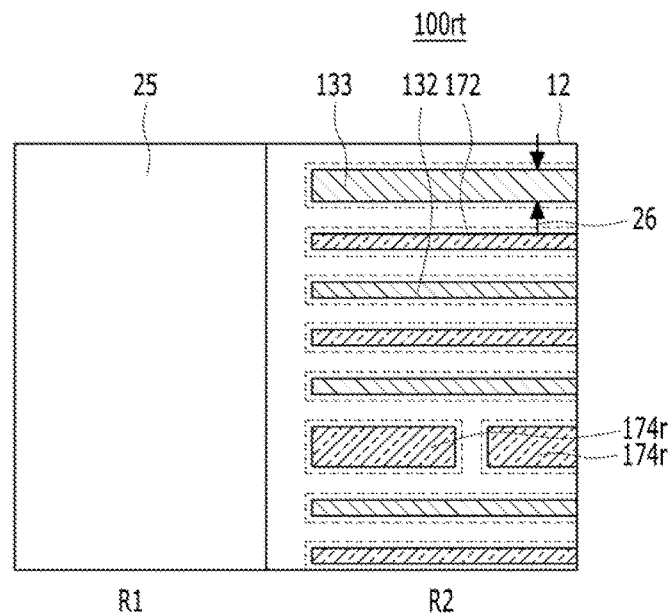
FIGS. 3A and 3B are plan views illustrating a method for forming patterns of a semiconductor device in accordance with a variation of the first embodiment.
Figure 3B:
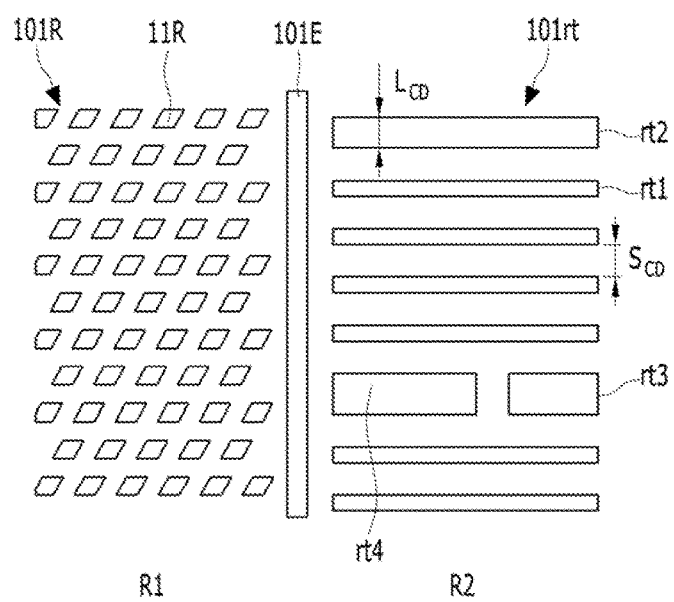

FIGS. 3A and 3B are plan views illustrating a method for forming patterns of a semiconductor device in accordance with a variation of the first embodiment. The variation of the first embodiment is a method of decreasing a line critical dimension (line CD) and increasing a space critical dimension (space CD) of a random array pattern. As shown in FIGS. 1A to 1M, the regular array feature 100R and the random array feature 100r are formed.

Next, as shown in FIG. 3A, an open mask 25 is formed to selectively open the second region R2. By the open mask 25, the random array feature 100r may be exposed and the regular array feature 100R may not be exposed. For example, the cut wide-width random second lines 174r, the random second lines 172, the random first lines 132 and the wide-width random first line 133 may be exposed.

Next, a trimming process 26 may be performed. The random array feature 100r may be subject to the trimming process 26. Thus, the random array feature 100r may be trimmed. For example, the cut wide-width random second lines 174r, the random second lines 172, the random first lines 132 and the wide-width random first line 133 may be trimmed and each have reduced widths compared with the non-trimmed patterns. By the trimming process 26 described above, a random array feature 100rt may be formed.

As shown in FIG. 3B, the open mask 25 is removed. Subsequently, the etch target layer 11 is etched by the series of etching processes as shown in FIGS. 1N and 1O. Thus, a regular array pattern 101R and a random array pattern 101rt may be concurrently formed. The regular array pattern 101R may include a plurality of regular patterns 11R. The random array pattern 101rt may include a plurality of random patterns rt1, rt2, rt3 and rt4. The random patterns rt1, rt2, rt3 and rt4 may be trimmed patterns and have reduced widths compared with the non-trimmed patterns.

As may be seen, in the variation of the first embodiment, since the trimming process 26 is included, it is possible to form the random array pattern 101rt with a decreased line critical dimension (LCD) and an increased space critical dimension (SCD).

Figure 4A:
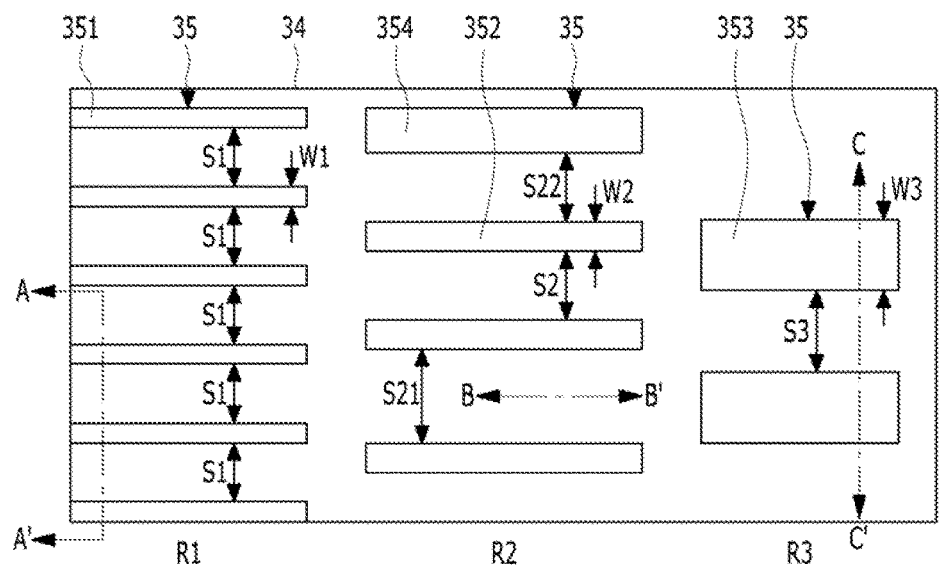
FIGS. 4A to 4P are plan views illustrating a method for forming patterns of a semiconductor device in accordance with a second embodiment.
Figure 4B:
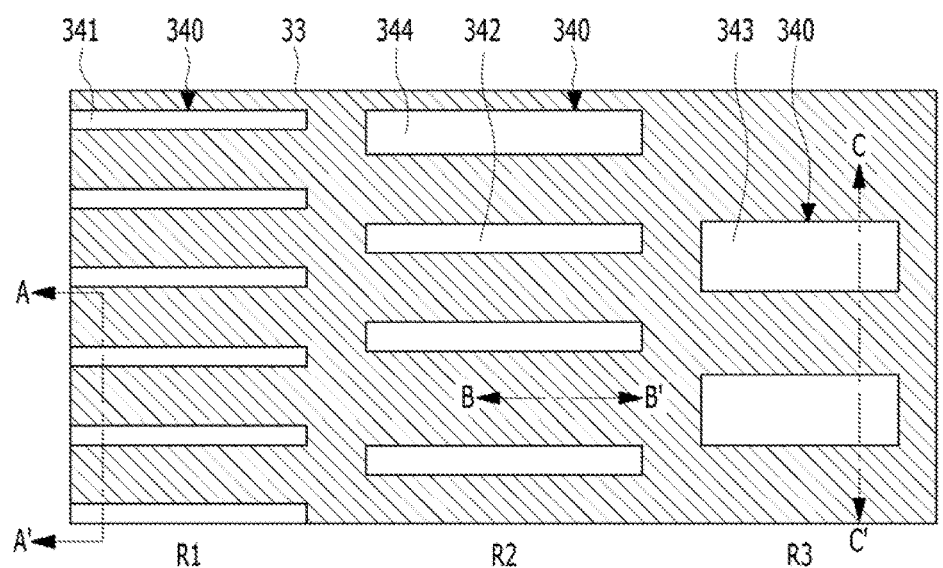
Figure 4C:
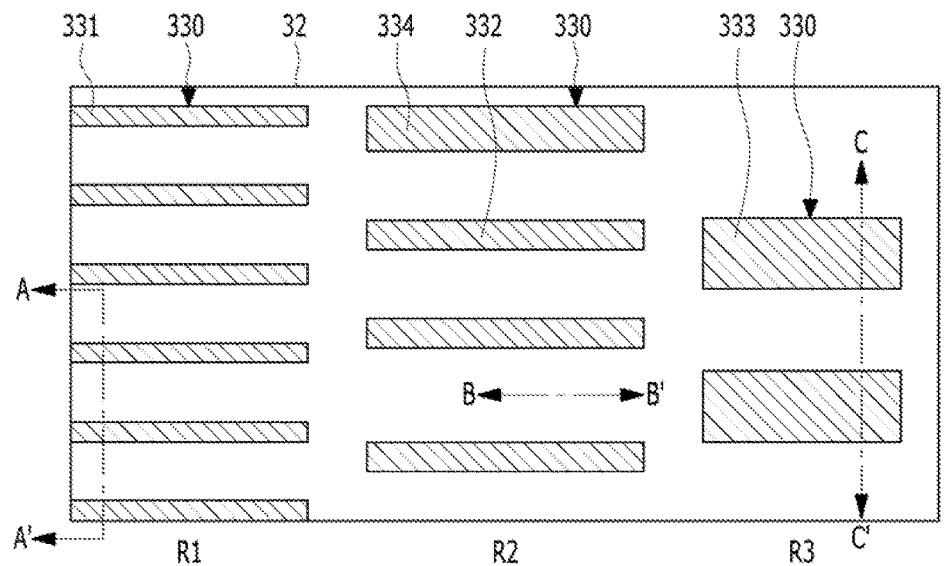
Figure 4D:
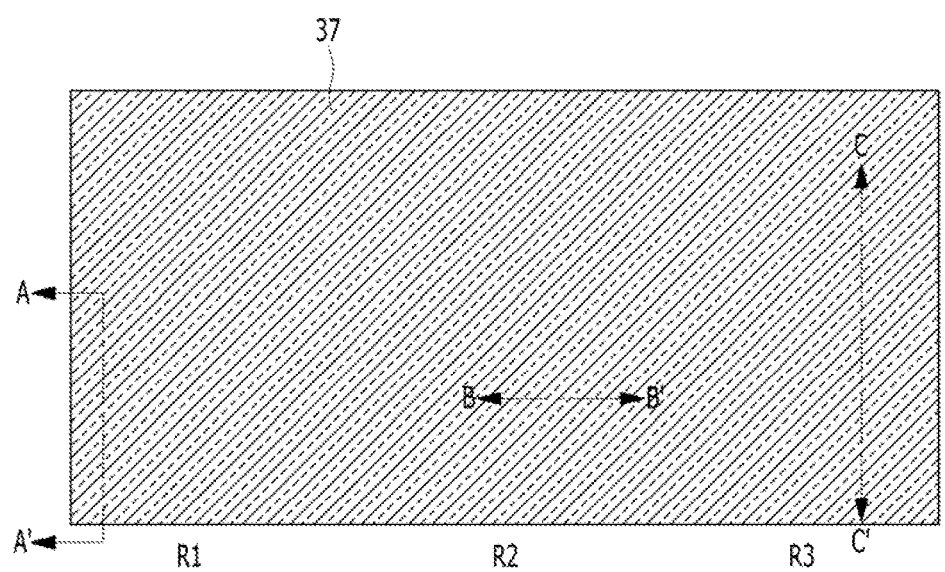
Figure 4E:
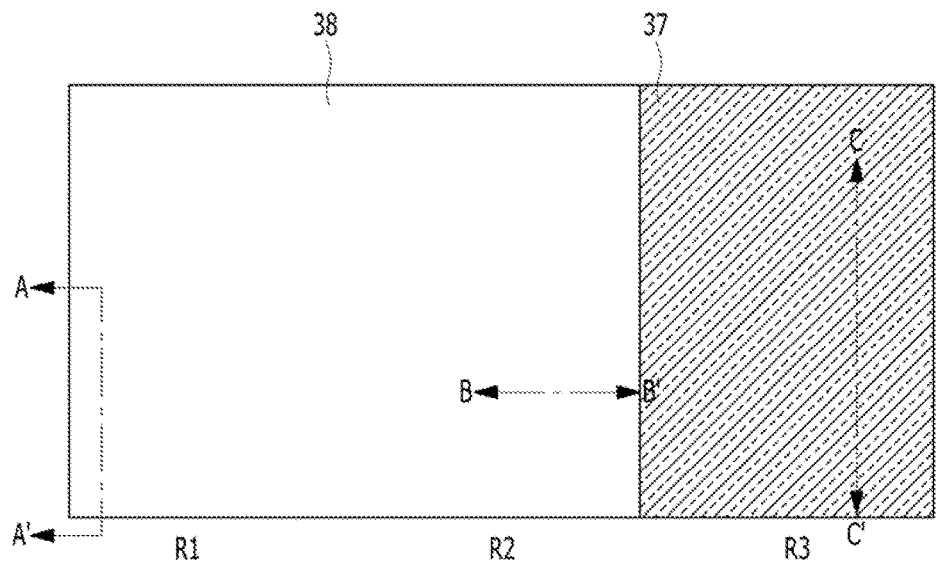
Figure 4F:
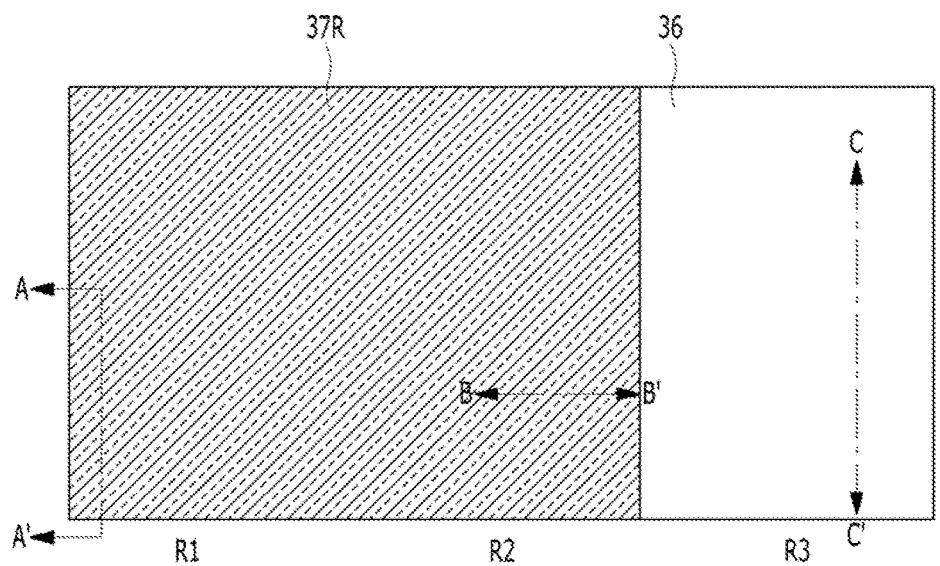
Figure 4G:
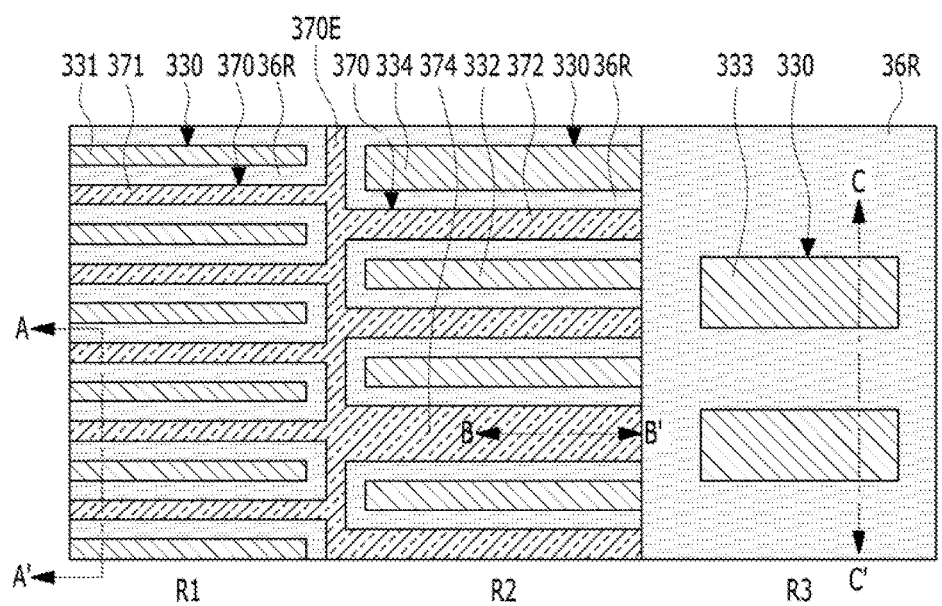
Figure 4H:
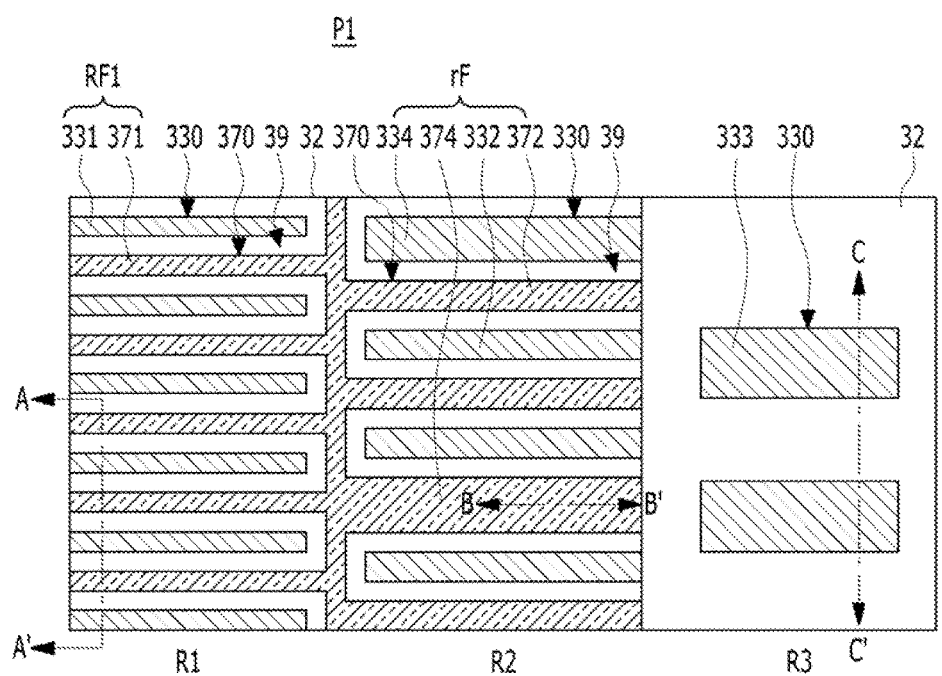
Figure 4I:
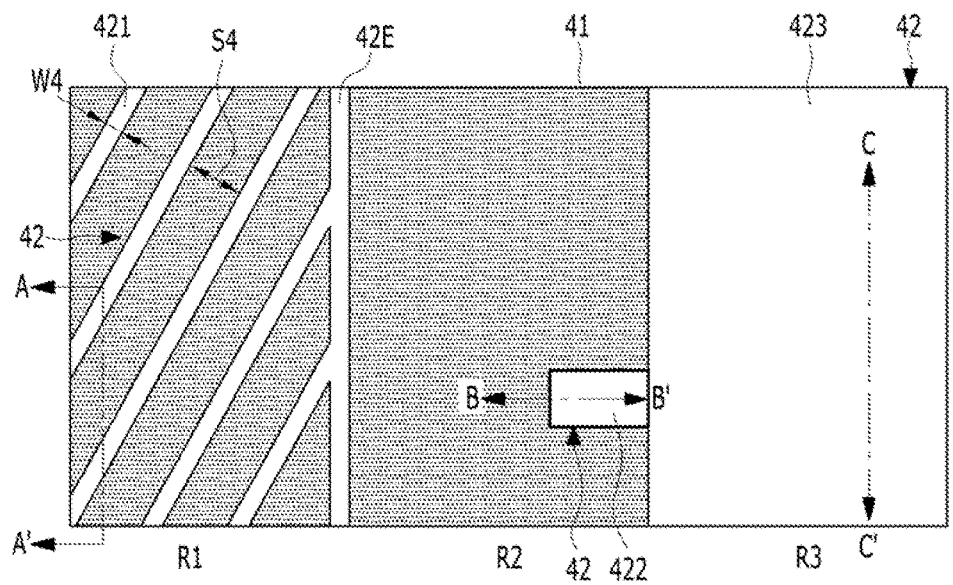
Figure 4J:
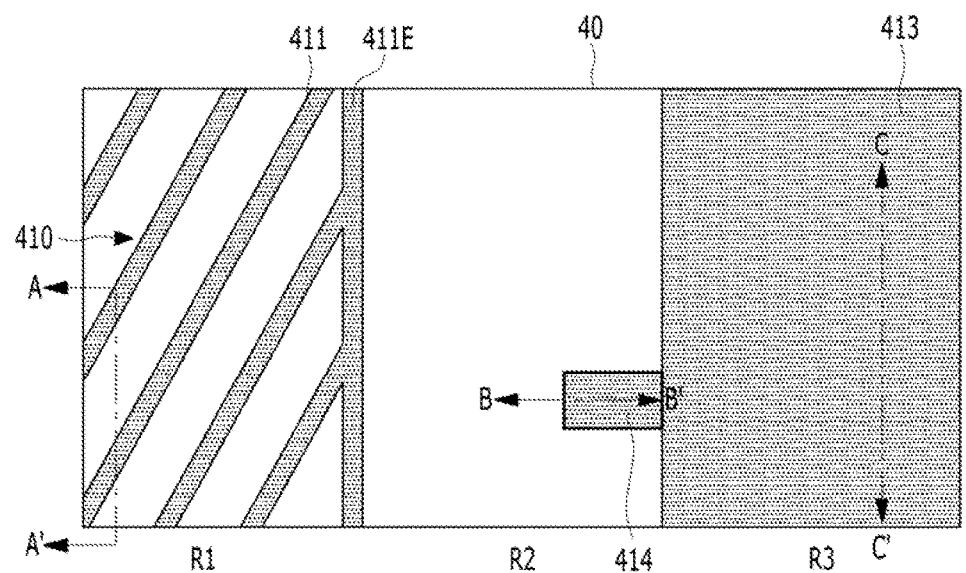
Figure 4K:
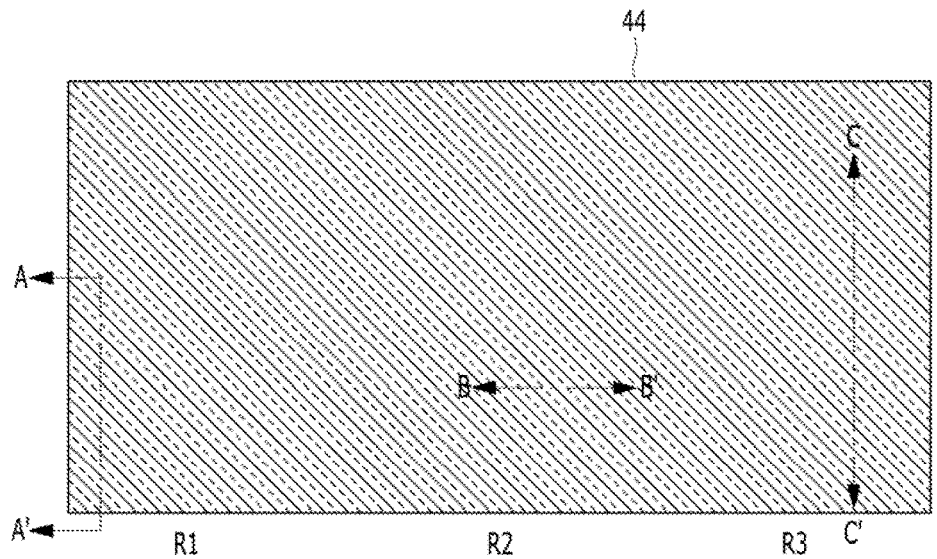
Figure 4L:
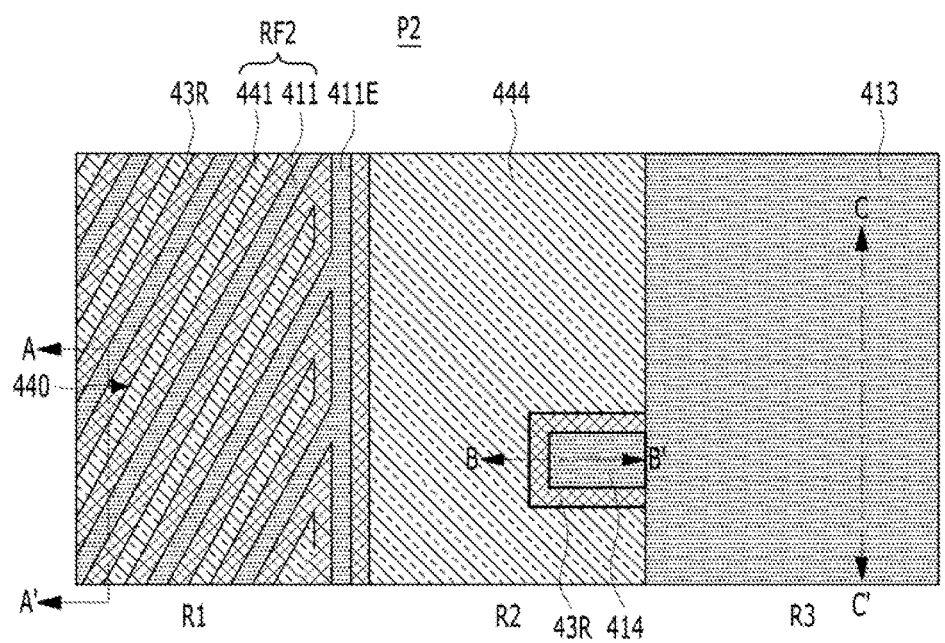
Figure 4M:
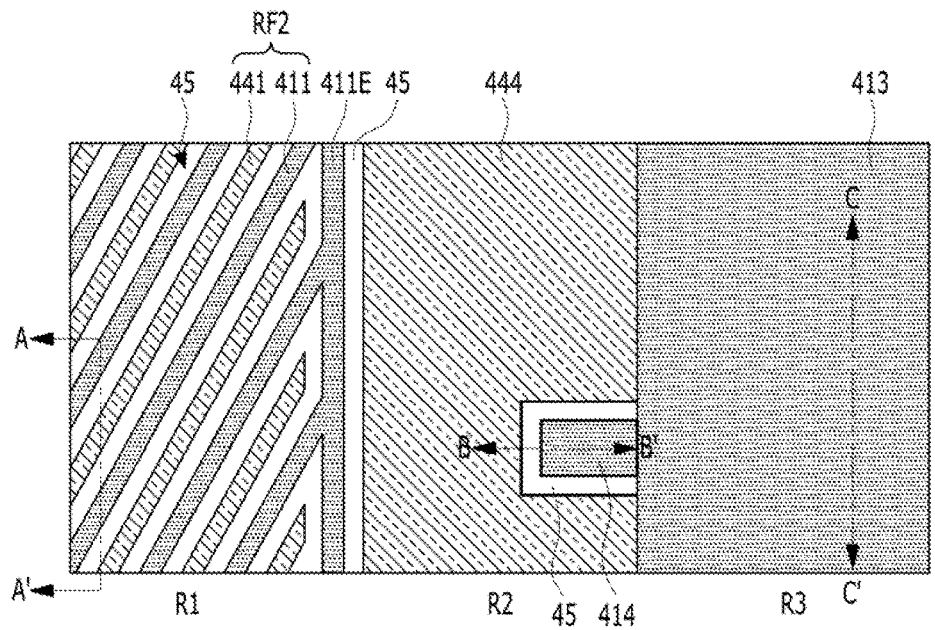
Figure 4N:
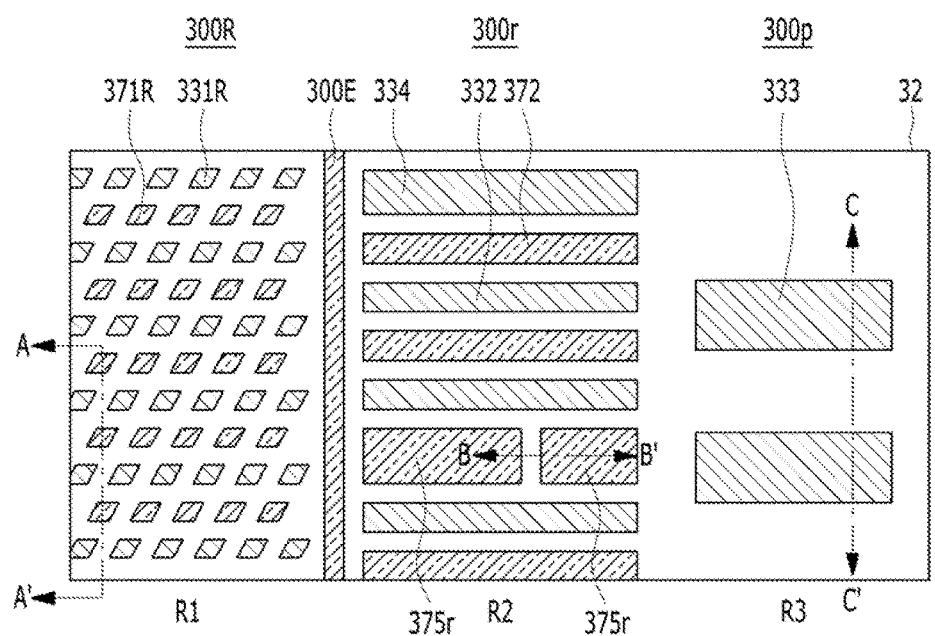
Figure 4O:
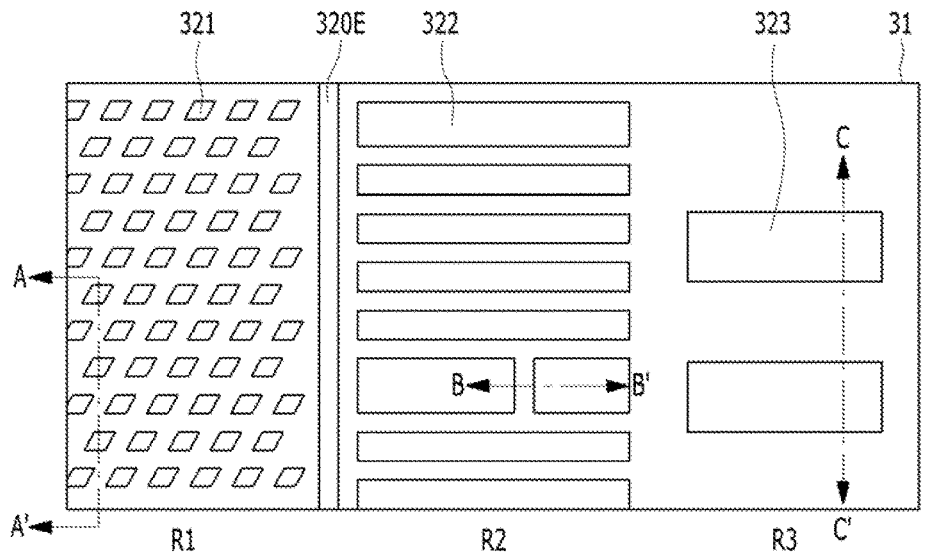
Figure 4P:
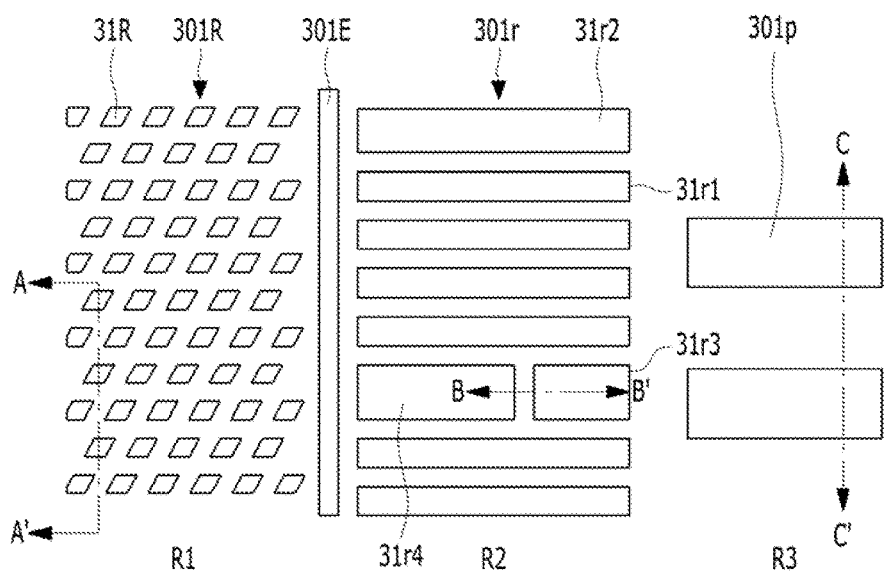
Figure 5A:
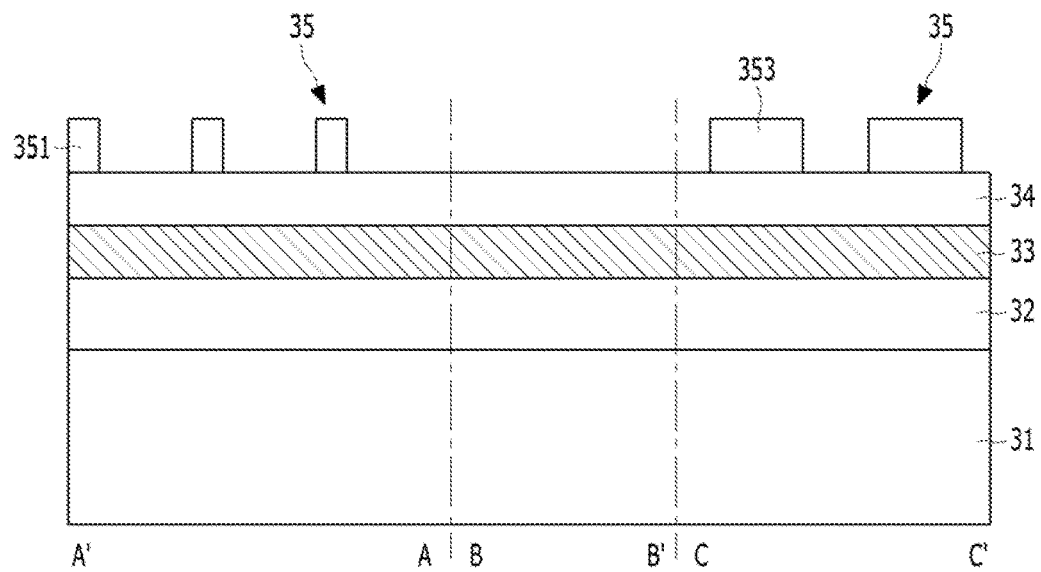
FIGS. 5A to 5P are cross-sectional views taken along the lines A-A', B-B' and C-C' of FIGS. 4A to 4P.

FIGS. 4A to 4P are plan views illustrating a method for forming patterns of a semiconductor device in accordance with a second embodiment. FIGS. 5A to 5P are cross-sectional views taken along the lines A-A', B-B' and C-C' of FIGS. 4A to 4P.

As shown in FIGS. 4A and 5A, an etch target layer 31 may be prepared. The etch target layer 31 may include suitable materials for semiconductor processing. The etch target layer 31 may include a semiconductor substrate. For example, the semiconductor substrate may include a silicon substrate, a silicon germanium (SiGe) substrate or an Silicon On Insulator (SOI) substrate. Also, the etch target layer 31 may include a dielectric material or a conductive material. For example, the etch target layer 31 may include a silicon oxide, a silicon nitride, a polysilicon, a metallic material, or a combination thereof.

The etch target layer 31 may include a first region R1, a second region R2 and a third region R3. The first region R1 may be a region formed with a regular array pattern. The second region R2 may be a region formed with a random array pattern. The third region R3 may be a region formed with a large pitch pattern. The density of patterns formed in the first region R1 is high, and the density of patterns formed in the third region R3 is low. Patterns formed in the second region R2 may have a density lower than the first region R1 and higher than the third region R3. For example, in the case when the present embodiment is applied to a DRAM, the first region R1 may include a cell array region, the second region R2 may include a core region, and the third region R3 may include a peripheral circuit region. The large pitch pattern may be a pattern which has a width and a pitch larger than the regular array pattern and the random array pattern. The regular array pattern and the random array pattern may be formed by a spacer patterning technology (SPT). The large pitch pattern may be formed by a single mask and etching.

As will be described later, processes for forming the regular array pattern, the random array pattern and the large pitch pattern may be integrated. In the regular array pattern, a plurality of patterns with the same shape, hereinafter, referred to as "regular patterns", may be arranged at a regular pitch. A pitch refers to the sum of the width of each pattern and the interval between patterns. In the random array pattern, a plurality of patterns with different shapes, that is, random shapes, hereinafter, referred to as "random patterns", may be arranged at random pitches. In the large pitch pattern, a plurality of large patterns with the same shape may be arranged at a regular pitch that is, a uniform pitch, or a random pitch that is, a non-uniform pitch.

A hard mask layer 32 may be formed on the etch target layer 31. The hard mask layer 32 may include a material which has an etching selectivity with respect to the etch target layer 31. The hard mask layer 32 may include a silicon oxide, a silicon oxynitride, a polysilicon, an amorphous carbon, or a combination thereof. The hard mask layer 32 may be used as an etch mask for etching the etch target layer 31. The hard mask layer 32 may be a multi-layered structure. For example, the hard mask layer 32 may be formed by stacking an amorphous carbon layer and a silicon oxynitride (SiON) layer.

A first line layer 33 may be formed on the hard mask layer 32. The first line layer 33 may be formed of a material which has an etching selectivity with respect to the hard mask layer 32. The first line layer 33 may include a silicon oxide, a silicon oxynitride, a polysilicon, an amorphous carbon, or a combination thereof. The first line layer 33 may be used as an etch mask for etching the hard mask layer 32. The first line layer 33 may include a polysilicon.

A sacrificial layer 34 may be formed on the first line layer 33. The sacrificial layer 34 may be formed of a material which has an etching selectivity with respect to the first line layer 33. The sacrificial layer 34 may be formed by stacking a plurality of layers. The sacrificial layer 34 may be formed by stacking an amorphous carbon layer and a silicon oxynitride layer.

First masks 35 may be formed on the sacrificial layer 34. The first masks 35 may be formed by a lithography process. For example, the first masks 35 may be formed by an immersion lithography process. The first masks 35 may include photoresist patterns. The first masks 35 may be line/space type patterns. The first masks 35 may include a plurality of first parts 351 which are positioned in the first region R1, a plurality of second parts 352 which are positioned in the second region R2, and a plurality of third parts 353 which are positioned in the third region R3.

The first parts 351 may have a first width W1, and neighboring first parts 351 may be regularly arranged with a first space S1. The second parts 352 may have a second width W2, and neighboring second parts 352 may be irregularly arranged with second spaces S2 and S21. The third parts 353 may have a third width W3, and neighboring third parts 353 may be regularly arranged with a third space S3. The first width W1, the second width W2 and the third width W3 may be different from one another. The first space S1, the second spaces S2 and S21 and the third space S3 may be different from one another. In this way, the first parts 351, the second parts 352 and the third parts 353 which are respectively formed in the first region R1, the second region R2 and the third region R3 may be formed with different widths and spaces, that is, different pitches. The second region R2 may further include a wide-width second part 354 which has a width larger than the second parts 352. The wide-width second part 354 may be larger in its width than the second parts 352 and smaller in its width than the third parts 353. A space S22 between the second part 352 and the wide-width second part 354 may be the same as or different from the second space S2.

In this way, the first masks 35 may include regular parts, random parts and large pitch parts. The regular parts may include the plurality of first parts 351, and the random parts may include the plurality of second parts 352 and the wide-width second part 354. The large pitch parts may include the plurality of third parts 353. As the regular parts, the plurality of first parts 351 may be formed at a regular pitch that is, at a uniform pitch, and, as the random parts, the plurality of second parts 352 and the wide-width second part 354 may be formed at irregular pitches that is, at a non-uniform pitch. The first parts 351, the second parts 352, the wide-width second part 354 and the third parts 353 may be line shapes which extend in a first direction.

Figure 5B:
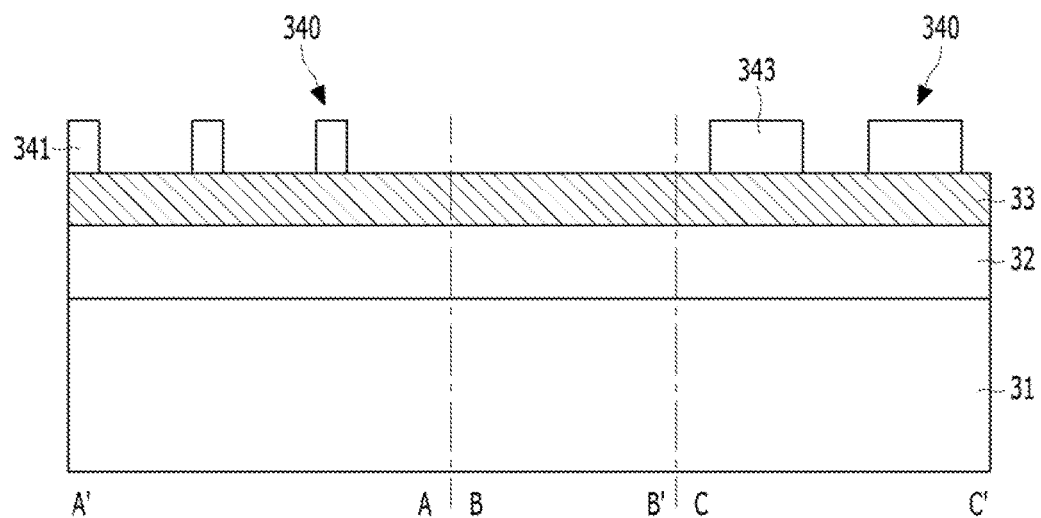

As shown in FIGS. 4B and 5B, the sacrificial layer 34 may be etched. The sacrificial layer 34 may be etched using the first masks 35. Thus, sacrificial layer patterns 340 may be formed. When viewed on the top, the sacrificial layer patterns 340 may be the same in their shapes as the first masks 35. Accordingly, the sacrificial layer patterns 340 may include regular parts, random parts and large pitch parts. The sacrificial layer patterns 340 may include first parts 341, second parts 342, a wide-width second part 344 and third parts 343. The first parts 341 of the sacrificial layer patterns 340 have the same shape as the first parts 351 of the first masks 35. The second parts 342 and the wide-width second part 344 of the sacrificial layer patterns 340 have the same shapes as the second parts 352 and the wide-width second part 354 of the first masks 35, respectively. The third parts 343 of the sacrificial layer patterns 340 have the same shape as the third parts 353 of the first masks 35.

In order to form the sacrificial layer patterns 340, the sacrificial layer 34 is etched by using, for example, the first masks 35 as etch barriers. Thus, the sacrificial layer patterns 340 may be formed. Next, the first masks 35 may be removed.

Figure 5C:
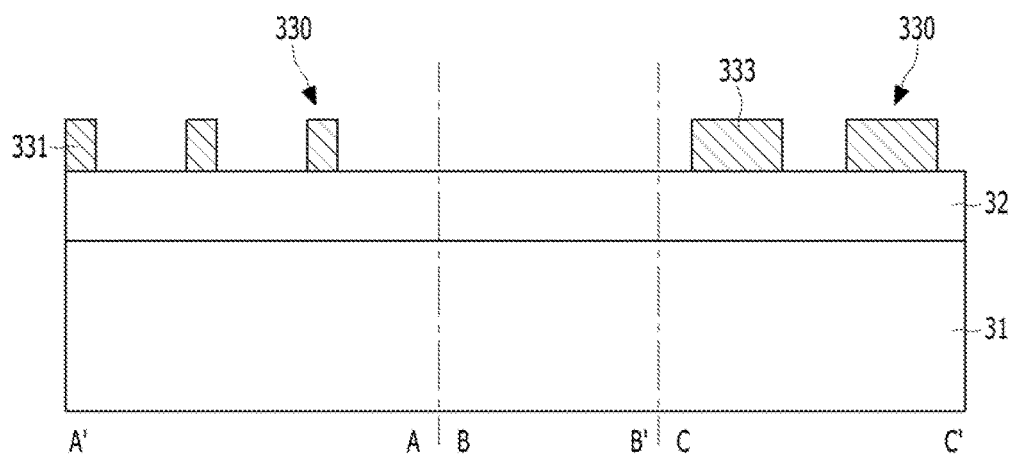

As shown in FIGS. 4C and 5C, the first line layer 33 may be etched. Thus, a plurality of first lines 330 may be formed. The first lines 330 may be the same in their shapes as the sacrificial layer patterns 340. Accordingly, the first lines 330 may include regular parts, random parts and large pitch parts. For example, the first lines 330 may include first parts 331, second parts 332, third parts 333, and a wide-width second part 334. The first parts 331 of the first lines 330 have the same shape as the first parts 341 of the sacrificial layer patterns 340. The second parts 332 and the wide-width second part 334 of the first lines 330 have the same shapes as the second parts 342 and the wide-width second part 344 of the sacrificial layer patterns 340, respectively. The third parts 333 of the first lines 330 have the same shape as the third parts 343 of the sacrificial layer patterns 340.

In order to form the first lines 330, the first line layer 33 may be etched by using, for example, the sacrificial layer patterns 340 as etch barriers. In this way, the first lines 330 may be concurrently formed in the first region R1, the second region R2 and the third region R3. When viewed on the top, the second parts 332 and the wide-width second part 334 may be formed with irregular spaces in the second region R2. The first parts 331 are regularly formed in the first region R1, and the third parts 333 are regularly formed in the third region R3.

Hereinafter, the first parts 331 formed in the first region R1 will be referred to as "regular first lines 331", and the second parts 332 and the wide-width second part 334 formed in the second region R2 will be respectively referred to as "random first lines 332" and a "wide-width random first line 334". The third parts 333 formed in the third region R3 will be referred to as "large pitch first lines 333".

Figure 5D:
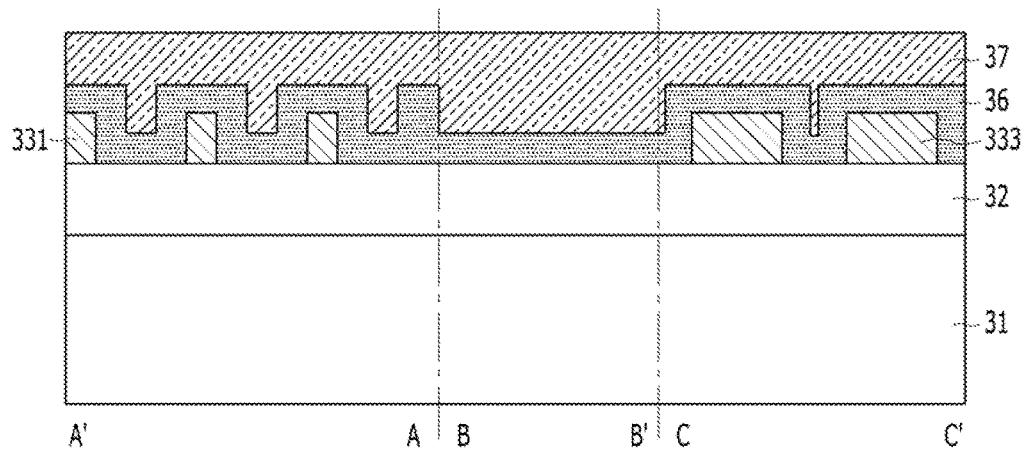

As shown in FIGS. 4D and 5D, a first spacer layer 36 may be formed. The first spacer layer 36 may be conformally formed on the entire surface including the regular first lines 331, the random first lines 332, the wide-width random first line 334 and the large pitch first lines 333. The first spacer layer 36 may include a material which has an etching selectivity with respect to the regular first lines 331, the random first lines 332, the wide-width random first line 334 and the large pitch first lines 333. The first spacer layer 36 may include a silicon oxide. The first spacer layer 36 may be formed of an ultra low temperature oxide (ULTO).

Next, a second line layer 37 may be formed on the first spacer layer 36. The second line layer 37 may be formed on the first spacer layer 36 while filling gaps between portions of the first spacer layer 36, that is, spaces between the regular first lines 331. The second line layer 37 may also be filled between neighboring random first lines 332 and between the random first line 332 and the wide-width random second line 334. The second line layer 37 may cover all the tops of the regular first lines 331, the random first lines 332, the wide-width random first line 334 and the large pitch first lines 333. Subsequently, the top surface of the second line layer 37 may be planarized. The second line layer 37 may be formed of a material which has an etching selectivity with respect to the first spacer layer 36. The second line layer 37 may include a polysilicon.

Figure 5E:
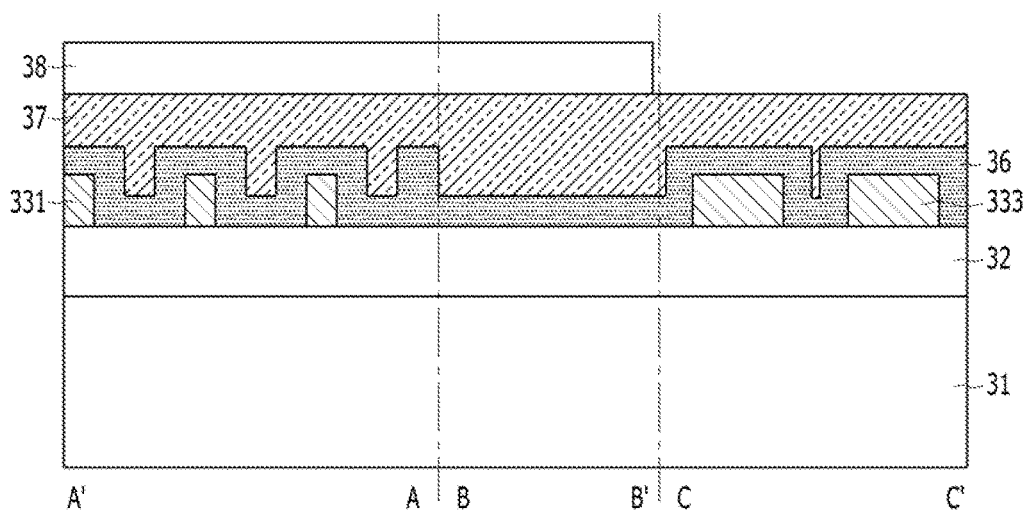

As shown in FIGS. 4E and 5E, a second mask 38 may be formed. The second mask 38 may be formed by a photolithography process. The second mask 38 may be formed using a KrF photoresist layer. The third region R3 may be selectively open by the second mask 38. Namely, the second mask 38 may cover the first region R1 and the second region R2. Accordingly, a portion of the second line layer 37, that is, the second line layer 37 formed in the third region R3 may be exposed by the second mask 38.

Figure 5F:
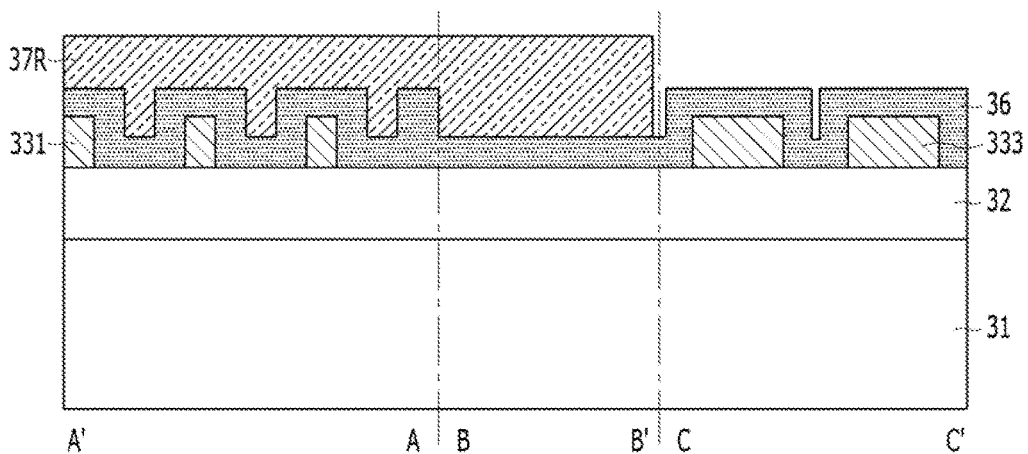

As shown in FIGS. 4F and 5F, the second line layer 37 may be selectively etched. That is to say, the second line layer 37 may be removed from the third region R3. Accordingly, a second line layer 37R may remain in the first region R1 and the second region R2.

The second mask 38 may be removed. In the third region R3, the first spacer layer 36 may be exposed.

Figure 5G:
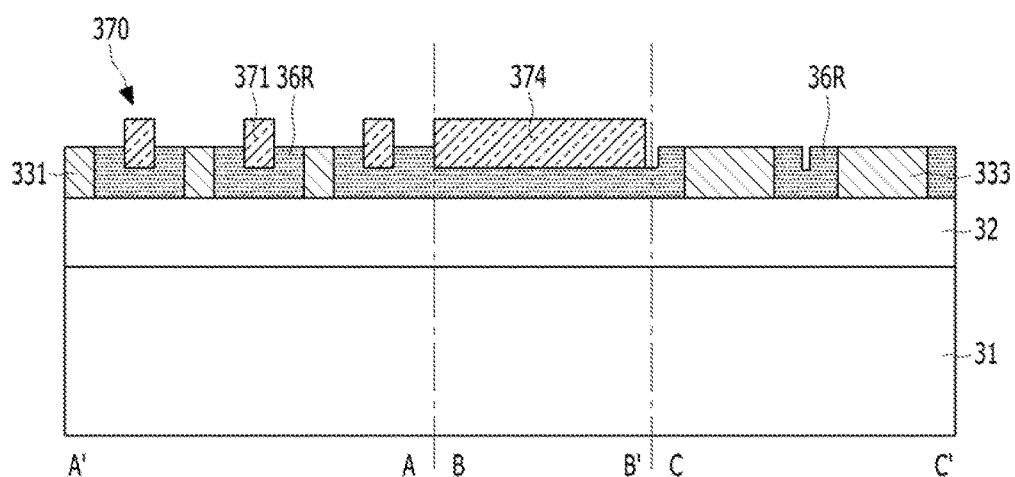

As shown in FIGS. 4G and 5G, the second line layer 37R is selectively etched. For example, the second line layer 37R is selectively etched by an etch-back process. Thus, a plurality of second lines 370 may be formed and the first spacer layer 36 may be exposed by the second lines 370.

Then, portions of the first spacer layer 36 are selectively etched. The portions of the first spacer layer 36 may be etched until the top surfaces of the first lines 330 are exposed. Thus, a first spacer layer 36R may selectively remain on only the bottoms and sidewalls of the second lines 370.

The plurality of second lines 370 may include regular parts and random parts. For example, the second lines 370 may include first parts 371, second parts 372, and a wide-width second part 374. The plurality of first parts 371 may be regularly formed in the first region R1, and the plurality of second parts 372 and the wide-width second part 374 may be formed at irregular pitches in the second region R2. Hereinafter, the first parts 371 formed in the first region R1 will be referred to as "regular second lines 371", and the second parts 372 formed in the second region R2 will be referred to as "random second lines 372".

The wide-width second part 374 will be referred to as a "wide-width random second line 374". The wide-width random second line 374 may be larger in its width than the random second lines 372. The second line 370 may be formed even in the interfacial area of the first region R1 and the second region R2. The second line 370 formed in the interfacial area of the first region R1 and the second region R2 will be referred to as an "edge second line 370E".

The regular second lines 371 may be positioned between the regular first lines 331, and the random second lines 372 and the wide-width random second line 374 may be positioned between the random first lines 332 and between the random first line 332 and the wide-width random first line 334. The regular first lines 331 and the regular second lines 371 may be the same as each other in line width. The random first lines 332 and the random second lines 372 may be different in line width.

The first spacer layer 36R may be positioned between the regular second lines 371 and the regular first lines 331, and may be positioned between the random second lines 372 and the random first lines 332. The first spacer layer 36R may also be positioned between the wide-width random second line 374 and the random first lines 332. The first spacer layer 36R may also remain between the wide-width random first line 334 and the random second line 372.

Figure 5H:
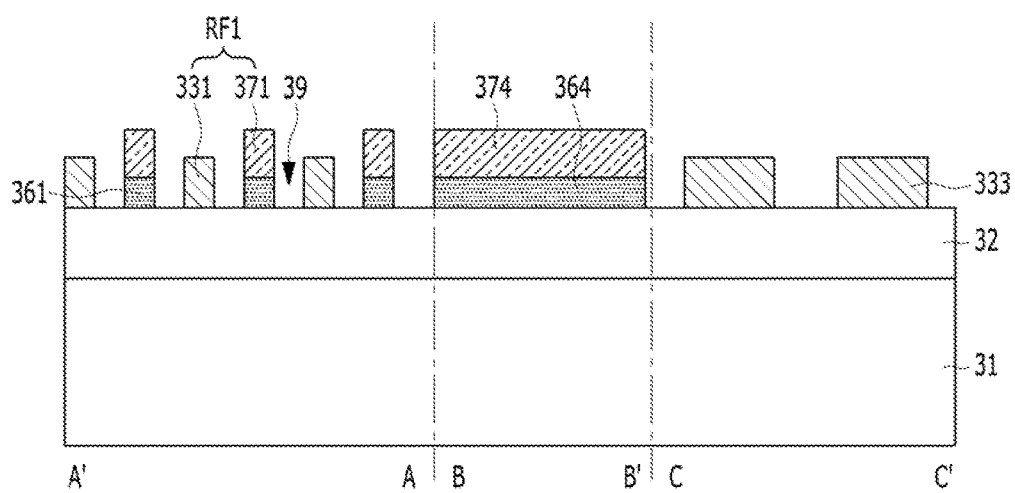

As shown in FIGS. 4H and 5H, the surface of the hard mask layer 32 is exposed. For example, the first spacer layer 36R is selectively etched between the regular first lines 331 and the regular second lines 371. Concurrently with this, the first spacer layer 36R may also be etched between the random second lines 372 and the random first lines 332, between the wide-width random second line 374 and the random first lines 332, and between the wide-width random first line 334 and the random second line 372. The first spacer layer 36R is removed from the region R3.

In this way, by etching the first spacer layer 36R, first spacer layer patterns 361 and 364 may be formed under the regular second lines 371 and the wide-width random second line 374. While not shown, first spacer layer patterns may also be formed under the random second lines 372.

Openings 39 may be formed between the regular first lines 331 and the regular second lines 371. When viewed from the top, the openings 39 may have shapes which surround the sidewalls of the regular first lines 331. Openings 39 may also be formed between the random first lines 332 and the random second lines 372, between the random first lines 332 and the wide-width random second line 374, and between the wide-width random first line 334 and the random second line 372. The width of the openings 39 may be determined by the width of the first spacer layer 36R. Therefore, the plurality of openings 39 may be the same in size.

The regular first lines 331 and the regular second lines 371 may be formed alternately with each other. In the first region R1, the regular first lines 331 and the regular second lines 371 may alternate at a regular pitch. In the second region R2, the random first lines 332, the random second lines 372, the wide-width random first line 334 and the wide-width random second line 374 may be arranged at irregular pitches.

The regular first lines 331 and the regular second lines 371 may become first regular features RF1 which are positioned in the first region R1. The random first lines 332, the random second lines 372, the wide-width random first line 334, and the wide-width random second line 374 may become random features rF which are positioned in the second region R2. The regular first lines 331, the random first lines 332, the regular second lines 371, the random second lines 372, the wide-width random first line 334, and the wide-width random second line 374 may be referred to as a first partition P1.

The first partition P1 may be positioned at a first level. The first level may mean a height level. The first partition P1 may be formed on the hard mask layer 32, and the surface portions of the hard mask layer 32 may be locally exposed by the plurality of openings 39. The series of processes for forming the first partition P1 are referred to as a negative spacer patterning technology (NSPT) process. Furthermore, in the third region R3, second lines may not be formed, and only the large pitch first lines 333 may be formed.

Figure 5I:
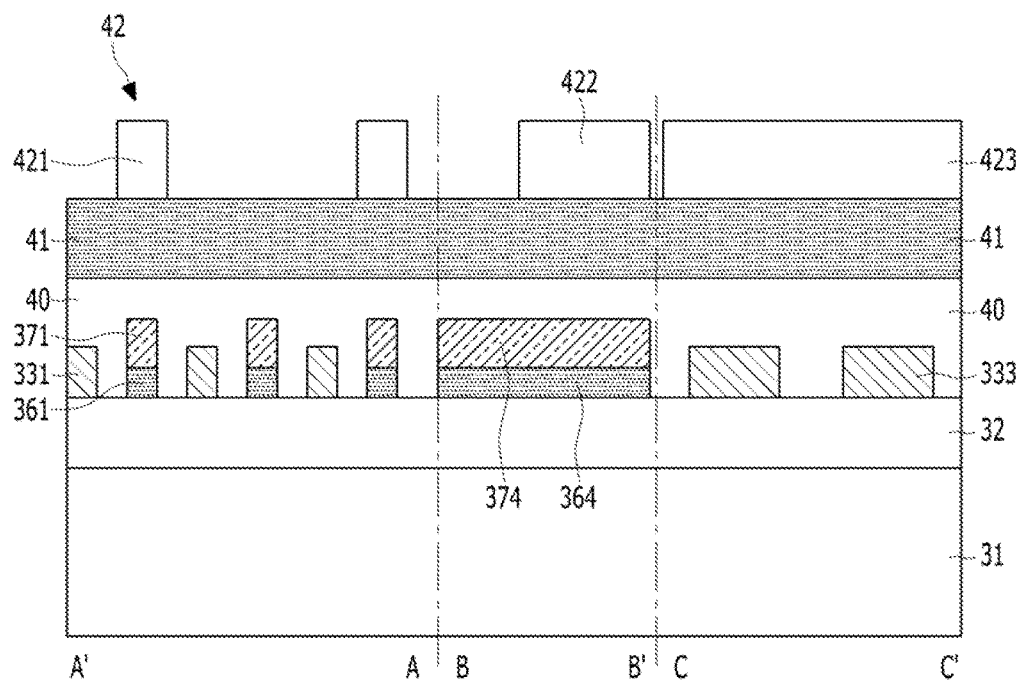

As shown in FIGS. 4I and 5I, a planarization layer 40 may be formed on the first partition P1. The planarization layer 40 may be formed by a spin-on coating method. The planarization layer 40 may include a spin-on carbon layer. A topology by the first partition P1 may be improved by the planarization layer 40. The planarization layer 40 may include a stack of a spin-on carbon (SOC) layer and a silicon oxynitride (SiON) layer.

A third line layer 41 may be formed on the planarization layer 40. The third line layer 41 may be formed of the same material as the planarization layer 40. The third line layer 41 may include a stack of a spin-on carbon (SOC) layer and a silicon oxynitride (SiON) layer.

Third masks 42 may be formed on the third line layer 41. The third masks 42 may be formed by a lithography process. For example, the third masks 42 may be formed by an immersion lithography process. The third masks 42 may include photoresist patterns. Some of the third masks 42 may be line/space type patterns. The third masks 42 may include a plurality of first parts 421 which are positioned in the first region R1, a second part 422 which is positioned in the second region R2, and a third part 423 which is positioned in the third region R3. The first parts 421 may have a fourth width W4, and neighboring first parts 421 may be regularly arranged with a fourth space S4. Hereinafter, the first parts 421 will be referred to as regular parts 421.

One second part 422 may be independently formed in the second region R2. Hereinafter, the second part 422 will be referred to as an island shape part 422. The island shape part 422 may partially overlap with the wide-width random second line 374. The third part 423 may cover the entire area of the third region R3. Hereinafter, the third part 423 will be referred to as a block part 423. The third masks 42 may further include an edge part 42E which is formed in the interfacial area of the first region R1 and the second region R2.

In this way, the third masks 42 may include the regular parts 421, the island shape part 422 and the blocking part 423. The regular parts 421 may be formed at a regular pitch. The regular parts 421 may be line shapes which extend in any one direction. The regular parts 421 may cross the first partition P1. When viewed from the top, the regular parts 421 of the third masks 42 may cross each of the regular first lines 331 and the regular second lines 371 at an angle of about 45°.

Figure 5J:
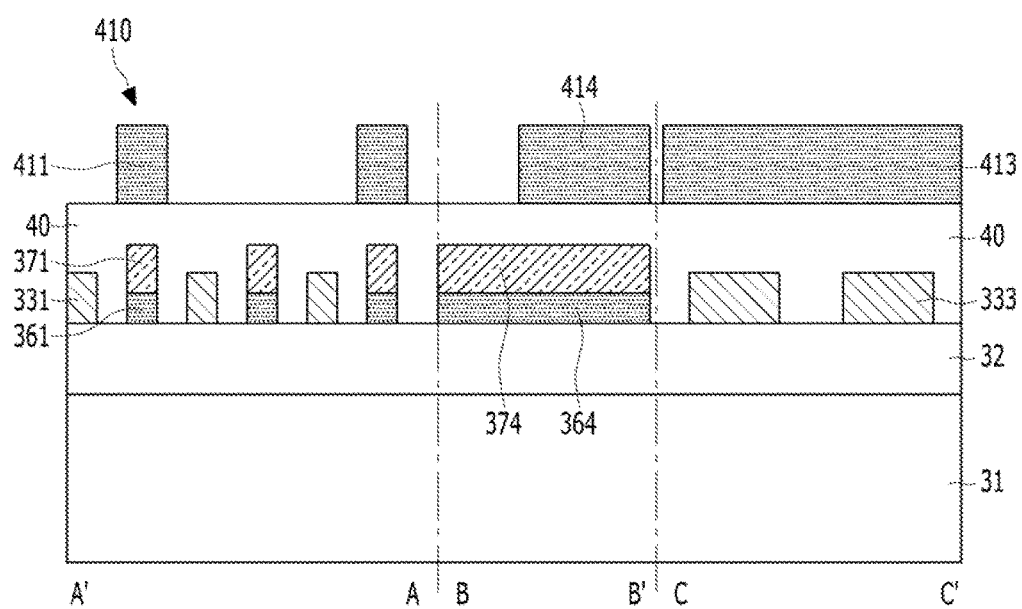

As shown in FIGS. 4J and 5J, the third line layer 41 may be selectively etched. For example, the third line layer 41 is etched using the third masks 42. Thus, third lines 410 may be formed. A first cutting barrier 414 and a blocking barrier 413 may be formed concurrently with the third lines 410. The first cutting barrier 414 may be formed in the second region R2. The blocking barrier 413 may be formed in the third region R3. The first cutting barrier 414 has a shape that partially overlaps with the wide-width random second line 374. The blocking barrier 413 may cover the entire area of the third region R3.

The third lines 410 may include a plurality of regular third lines 411. The reference numeral 411E may designate a part of the third lines 410 which is formed in the interfacial area of the first region R1 and the second region R2, that is, an edge third line.

In this way, the third lines 410 may be formed in the first region R1. When viewed from the top, the third lines 410 may have the same shape as the regular parts 421 of the third masks 42. Accordingly, the regular third lines 411 may be regularly formed in the first region R1. The regular third lines 411 may cross the first partition P1. That is, the regular third lines 411 may cross each of the regular first lines 331 and the regular second lines 371 at an angle of about 45°. In order to form the third lines 410, the third line layer 41 is etched using, for example, the third masks 42. Next, the third masks 42 may be removed.

Figure 5K:
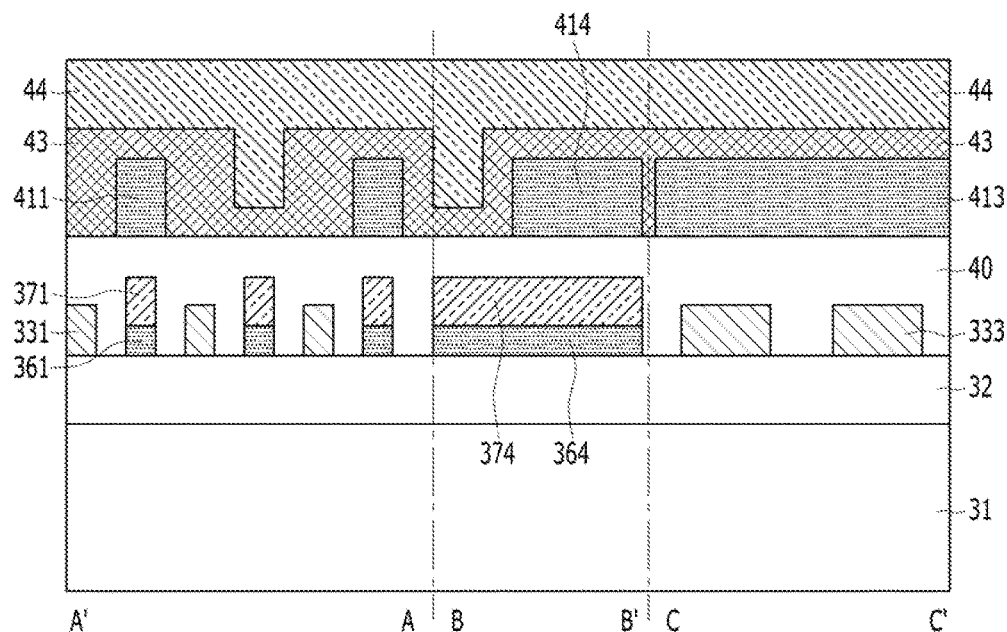

As shown in FIGS. 4K and 5K, a second spacer layer 43 may be formed. The second spacer layer 43 may be conformally formed on the entire surface including the regular third lines 411, the first cutting barrier 414 and the blocking barrier 413. The second spacer layer 43 may include a material which has an etching selectivity with respect to the regular third lines 411, the first cutting barrier 414 and the blocking barrier 413. The second spacer layer 43 may include a silicon oxide.

Next, a fourth line layer 44 may be formed on the second spacer layer 43. The fourth line layer 44 may be formed on the second spacer layer 43 while filling gaps between portions of the second spacer layer 43, that is, spaces between the regular third lines 411. Subsequently, the top surface of the fourth line layer 44 may be planarized. The fourth line layer 44 may cover all of the first region R1, the second region R2 and the third region R3. The fourth line layer 44 may be formed of a material which has an etching selectivity with respect to the second spacer layer 43. The fourth line layer 44 may include a polysilicon. The fourth line layer 44 may use a spin-on carbon instead of a polysilicon.

Figure 5L:
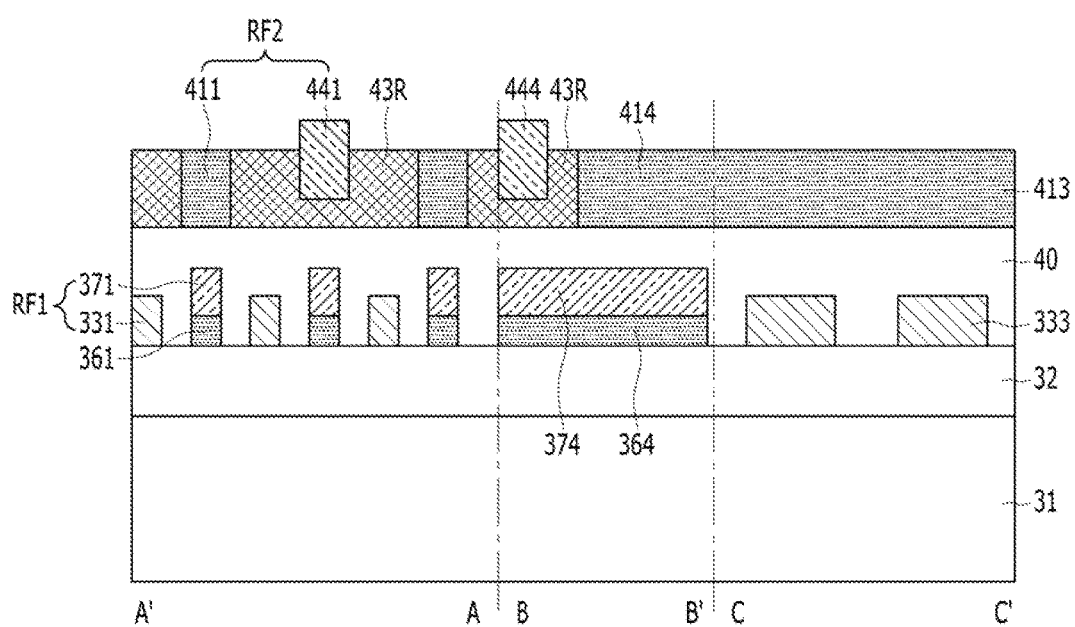

As shown in FIGS. 4L and 5L, the fourth line layer 44 is selectively etched. For example, the fourth line layer 44 is selectively etched by an etch-back process. Thus, a plurality of fourth lines 440 may be formed, and the second spacer layer 43 may be exposed by the fourth lines 440. A second cutting barrier 444 may be formed concurrently with the fourth lines 440. The second cutting barrier 444 may be formed in the second region R2 and cover the second region R2 while surrounding the first cutting barrier 414. The fourth line layer 44 may be entirely removed from the third region R3.

Then, portions of the second spacer layer 43 are selectively etched. The portions of the second spacer layer 43 may be etched until the top surfaces of the regular third lines 411 are exposed. Thus, a second spacer layer 43R may selectively remain on only the bottoms and sidewalls of the fourth lines 440.

The fourth lines 440 may include a plurality of regular fourth lines 441, and the regular fourth lines 441 may be regularly formed in the first region R1. The second cutting barrier 444 may be formed in the second region R2.

The regular fourth lines 441 may be positioned between the regular third lines 411. The regular third lines 411 and the regular fourth lines 441 may be the same in line width. The second spacer layer 43R may be positioned between the regular third lines 411 and the regular fourth lines 441, and may also be positioned between the first cutting barrier 414 and the second cutting barrier 444.

The regular third lines 411 and the regular fourth lines 441 may become second regular features RF2 which are positioned in the first region R1. The second regular features RF2 may be positioned over the first regular features RF1, and the first regular features RF1 and the second regular features RF2 may cross each other. The regular third lines 411 and the regular fourth lines 441 may be referred to as a second partition P2. The second partition P2 may be positioned at a second level. The second level height may be higher than the first level of the first partition P1. The second partition P2 may be formed over the first partition P1. The series of processes for forming the second partition P2 are referred to as a negative SPT (NSPT) process. Thus, an NSPT process is applied twice to form the first partition P1 and the second partition P2.

Figure 5M:
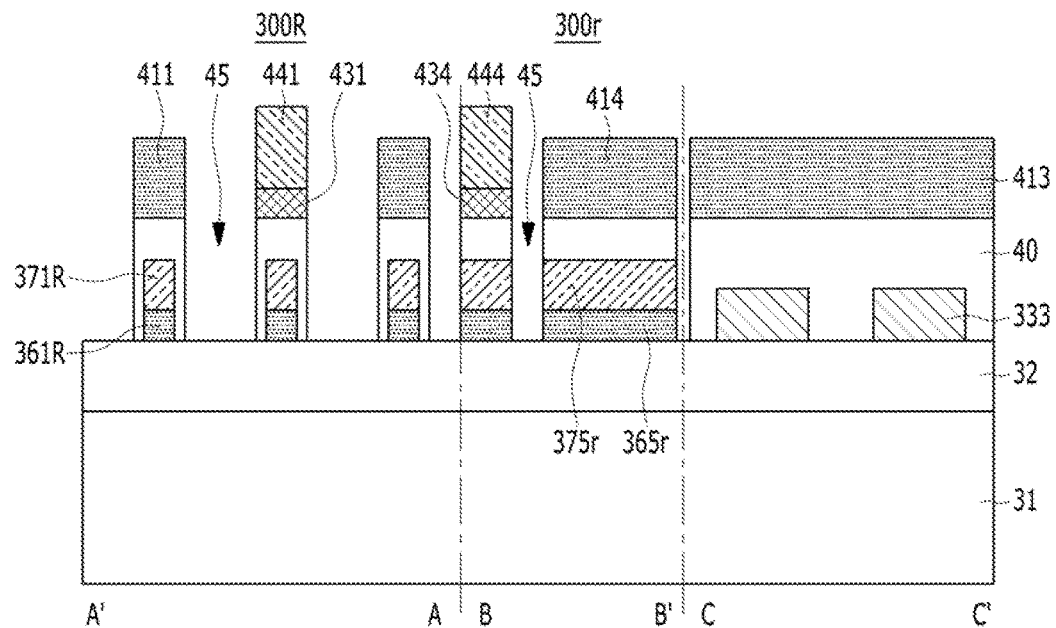

As shown in FIGS. 4M and 5M, a portion of the random features rF may be cut. In the present embodiment, the wide-width random second line 374 may be cut. For example, the wide-width random second line 374 is cut using the first cutting barrier 414 and the second cutting barrier 444 as etch barriers. First, the second spacer layer 43R between the first cutting barrier 414 and the second cutting barrier 444 is etched. Thus, the surface of the planarization layer 40 may be exposed. Then, by etching the planarization layer 40, the top surface of the wide-width random second line 374 is exposed. Then, the exposed wide-width random second line 374 is etched. Thus, the wide-width random second line 374 may be divided into cut wide-width random second lines 375r. A cutting part 45 may be formed between the cut wide-width random second lines 375r. In the second region R2, a random array feature 300r including the cut wide-width random second lines 375r may be formed.

When cutting the wide-width random second line 374 as described above, the regular second lines 371 may be etched in the first region R1. In the case when the regular second lines 371 and the regular first lines 331 are the same material, the regular first lines 331 may be etched as well. That is, the second spacer layer 43R and the planarization layer 40 are sequentially etched by using the regular third lines 411 and the regular fourth lines 441 as etch barriers. Thus, the regular first lines 331 and the regular second lines 371 are exposed. Then, cutting parts 45 are formed by etching the regular first lines 331 and the regular second lines 371. Thus, a regular array feature 300R may be formed in the first region R1. The regular array feature 300R may include first regular parts 331R which are formed by the cutting of the regular first lines 331 and second regular parts 371R which are formed by the cutting of the regular second lines 371 (see FIG. 4N).

Figure 5N:
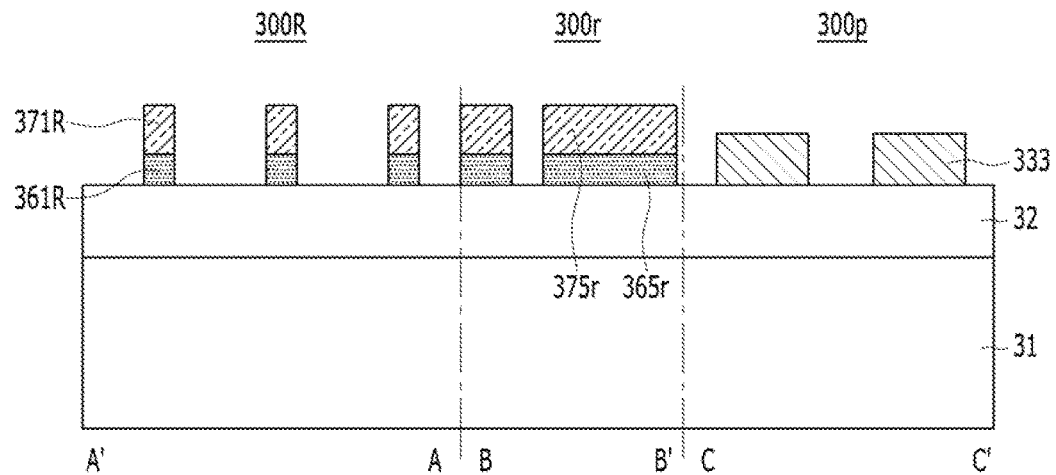

Second spacer layer patterns 431 and 434 may be formed under the regular fourth lines 441 and the second cutting barrier 444, respectively. As shown in FIGS. 4N and 5N, a cleaning process may be performed. Thus, all materials on the regular array feature 300R may be removed.

By performing the cleaning process, the regular array feature 300R may be formed in the first region R1. The regular array feature 300R may include the first regular parts 331R and the second regular parts 371R. The random array feature 300r may remain in the second region R2. The random array feature 300r may include the cut wide-width random second lines 375r, the random second lines 372, the random first lines 332 and the wide-width random first line 334. The large pitch feature 300p may be formed in the third region R3. The large pitch feature 300p may include the large pitch first lines 333. An edge feature 300E may be formed in the interfacial area of the first region R1 and the second region R2. The edge feature 300E may be positioned between the regular array feature 300R and the random array feature 300r.

As described above, in the second embodiment, processes for forming the regular array feature 300R, the random array feature 300r and the large pitch feature 300p may be integrated.

Figure 5O:
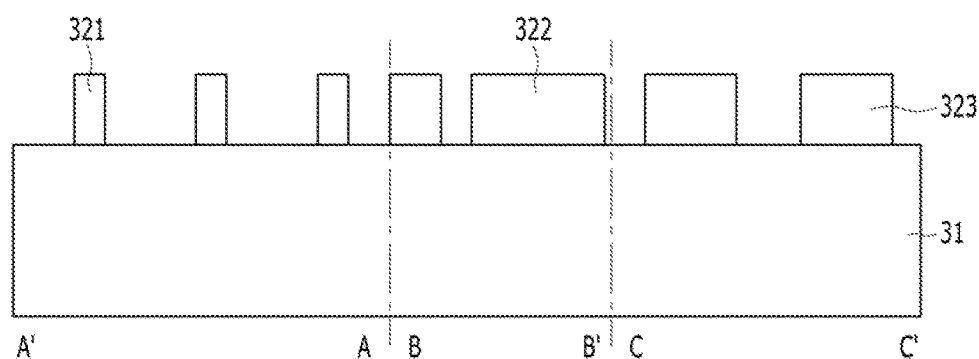
Figure 5P:
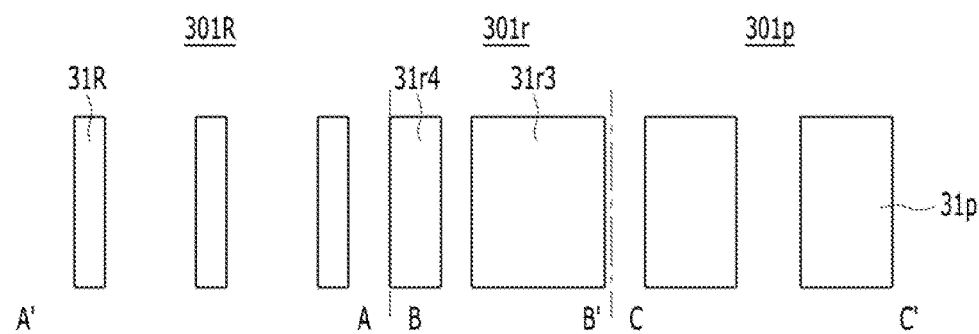

As shown in FIGS. 4O and 5O, the hard mask layer 32 is etched by using the regular array feature 300R, the random array feature 300r and the large pitch feature 300p as etch barriers. Thus, regular array hard mask patterns 321, random array hard mask patterns 322 and large pitch hard mask patterns 323 may be formed. The regular array hard mask patterns 321 may be formed in the first region R1. The random array hard mask patterns 322 may be formed in the second region R2. The large pitch hard mask patterns 323 may be formed in the third region R3. An edge hard mask pattern 320E may be formed between the regular array hard mask patterns 321 and the random array hard mask patterns 322. Next, the regular array feature 300R, the random array feature 300r and the large pitch feature 300p may be removed.

As shown in FIGS. 4P and 5P, the etch target layer 31 is etched by using the regular array hard mask patterns 321, the random array hard mask patterns 322 and the large pitch hard mask patterns 323 as etch barriers. Thus, a regular array pattern 301R, a random array pattern 301r, and large pitch patterns 301p may be concurrently formed. The regular array pattern 301R may include a plurality of regular patterns 31R. The random array pattern 301r may include a plurality of random patterns 31r1, 31r2, 31r3 and 31r4. An edge pattern 301E may be formed between the regular array feature 301R and the random array feature 301r. The edge pattern 301E may be formed by etching the etch target layer 31 using the edge hard mask pattern 320E as an etch barrier.

In another embodiment, the hard mask layer 32 may be omitted. In this case, to form the regular array pattern 301R, the random array pattern 301r and the large pitch patterns 301p, the etch target layer 31 may be directly etched by using the regular array feature 300R, the random array feature 300r and the large pitch feature 300p as etch barriers.

As described above, in the second embodiment, by using a method of applying an SPT process twice, the regular array pattern 301R, the random array pattern 301r, and the large pitch patterns 301p may be concurrently formed.

Figure 6A:
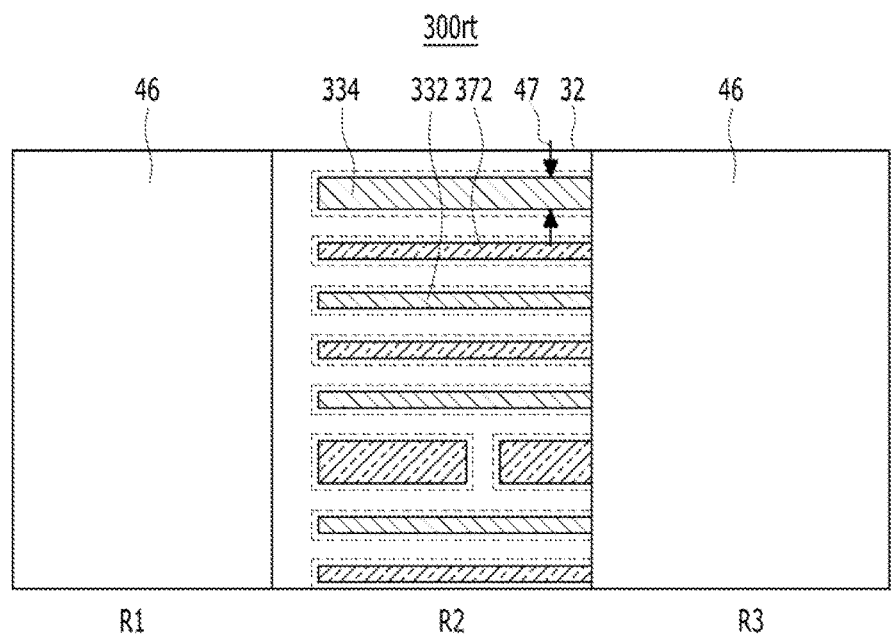
FIGS. 6A and 6B are plan views illustrating a method for forming patterns of a semiconductor device in accordance with a variation of the second embodiment.
Figure 6B:
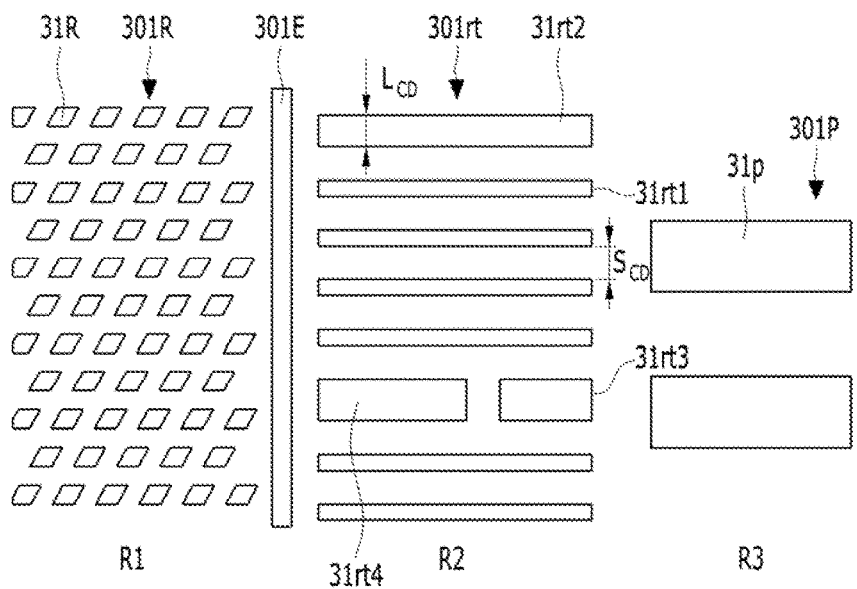

FIGS. 6A and 6B are plan views illustrating a method for forming patterns of a semiconductor device in accordance with a variation of the second embodiment. The variation of the second embodiment is a method of decreasing a line critical dimension (line CD) and increasing a space critical dimension (space CD) of a random array pattern. As shown in FIGS. 4A to 4N, the regular array feature 300R, the random array feature 300r, and the large pitch feature 300p are formed.

Next, as shown in FIG. 6A, an open mask 46 is formed to selectively open the second region R2. By the open mask 46, the random array feature 300r may be exposed, and the regular array feature 300R and the large pitch feature 300p may not be exposed.

A trimming process 47 may be performed. The exposed random array feature 300r may be subject to the trimming process 47. Thus, the random array feature 300r may be trimmed.

By the trimming process 47 described above, a random array feature 300rt with a decreased line critical dimension (LCD) and an increased space critical dimension (SCD) may be formed.

Subsequently, the etch target layer 31 is etched by the series of etching processes as shown in FIGS. 4O and 4P. Thus, a regular array pattern 301R and a random array pattern 301rt may be concurrently formed. The regular array pattern 301R may include a plurality of regular patterns 31R. The random array pattern 301rt may include a plurality of random patterns 31rt1, 31rt2, 31rt3 and 31rt4. The random patterns 31rt1, 31rt2, 31rt3 and 31rt4 may be trimmed patterns.

As may be seen in the variation of the second embodiment, since the trimming process 47 is included, it is possible to form the random array pattern 301rt with a decreased line critical dimension (LCD) and an increased space critical dimension (SCD).

The pattern forming methods according to the first embodiment, the variation of the first embodiment, the second embodiment and the variation of the second embodiment may be applied to a memory device. For example, they may be applied to a DRAM. For example, they may be applied to a sub word line driver and a sense amplifier. Moreover, they may be applied to a complicated line pattern. For example, they may be applied to a method for forming metal lines including lines and pads.

Although various embodiments have been described for illustrative purposes, it will be apparent to those skilled in the art that various changes and modifications may be made without departing from the spirit and scope of the invention as defined in the following claims.

What is claimed is:

1. A method for forming patterns of a semiconductor device, comprising:
preparing an etch target layer which includes a first region and a second region;
forming a regular first feature and a random feature, wherein the regular first feature is positioned over the etch target layer in the first region, wherein the random feature is positioned over the etch target layer in the second region;
forming a regular second feature, a first cutting barrier and a second cutting barrier, wherein the regular second feature is positioned over the regular first feature in the first region, wherein the first cutting barrier and the second cutting barrier is positioned over the random feature in the second region;
patterning the regular first feature by using the regular second feature as an etching mask to form a regular array feature;

patterning the random feature by using the first cutting barrier and the second cutting barrier as an etching mask to form a random array feature; and etching the etch target layer by using the regular array feature and the random array feature as an etch mask to form a regular array pattern and a random array pattern, wherein the regular first feature and the random feature are formed simultaneously by Spacer Patterning Technology (SPT), wherein each of the regular first feature and the random feature comprises a plurality of lines, and wherein the forming of the regular first feature and the random feature comprises:

forming a first line layer over the etch target layer;

forming a first mask over the first line layer;

etching the first line layer by using the first mask to form regular first lines and random first lines, wherein the regular first lines are positioned in the first region, wherein the random first lines are positioned in the second region;

forming a first spacer layer over the regular first lines and the random first lines;

forming a second line layer over the first spacer layer;

etching the second line layer to form regular second lines and random second lines, wherein the regular second lines are positioned between the regular first lines, wherein the random second lines are positioned between the random first lines; and removing the first spacer layer between each of the regular first lines and each of the regular second lines and between each of the random first lines and each of the random second lines.

2. The method according to claim 1, wherein the regular first feature and the regular second feature overlap with each other and cross each other.

3. The method according to claim 1, wherein each of the regular first feature and the regular second feature comprises a plurality of lines which are arranged at a uniform pitch.

4. The method according to claim 1, wherein the random feature comprises a plurality of lines which are arranged at a non-uniform pitch.

5. The method according to claim 1, wherein the forming of the regular second feature comprises:

forming a third line layer over an entire surface including the regular first feature;

forming a second mask over the third line layer;

etching the third line layer by using the second mask to form regular third lines;

forming a second spacer layer over the regular third lines;

forming a fourth line layer over the second spacer layer;

etching the fourth line layer to form regular fourth lines, wherein the regular fourth lines are positioned between the regular third lines; and removing the second spacer layer between the regular third lines and the regular fourth lines.

6. The method according to claim 5, wherein the regular third lines and the first cutting barrier are concurrently formed, and wherein the regular fourth lines and the second cutting barrier are concurrently formed.

7. The method according to claim 6, wherein the second spacer layer is formed between the first cutting barrier and the second cutting barrier, and wherein (i) the second spacer layer located between the first cutting barrier and the second cutting barrier and (ii) the random feature located under the second spacer layer and between the first cutting barrier and the second cutting barrier are sequentially etched to form the random array feature.

8. The method according to claim 1, further comprising:

before the forming of the regular second feature, forming a planarization layer over the regular first feature and the random feature.

9. The method according to claim 1, further comprising:

before the etching of the etch target layer, selectively trimming the random array feature.

10. A method for forming patterns of a semiconductor device, comprising:

forming a plurality of random first lines over an etch target layer;

forming a first spacer layer over the plurality of random first lines;

forming a plurality of random second lines, which fill spaces between the plurality of random first lines, over the first spacer layer;

forming a random feature including the plurality of random first lines and the plurality of random second lines by removing the first spacer layer;

forming a first cutting barrier over a portion of the random feature;

forming a second spacer layer over the first cutting barrier;

forming a second cutting barrier over the second spacer layer, wherein the second cutting barrier is located above the random feature and does not overlap with the first cutting barrier; and etching the second spacer layer and the random feature by using the first cutting barrier and the second cutting barrier as an etching mask.

* * * * *